US012131991B2

(12) United States Patent
Chandhok et al.

(10) Patent No.: US 12,131,991 B2
(45) Date of Patent: Oct. 29, 2024

(54) SELF ALIGNED GRATINGS FOR TIGHT PITCH INTERCONNECTS AND METHODS OF FABRICATION

(71) Applicant: Intel Corporation, Santa Clara, CA (US)

(72) Inventors: Manish Chandhok, Beaverton, OR (US); Leonard Guler, Hillsboro, OR (US); Paul Nyhus, Portland, OR (US); Gobind Bisht, Portland, OR (US); Jonathan Laib, Portland, OR (US); David Shykind, Buxton, OR (US); Gurpreet Singh, Portland, OR (US); Eungnak Han, Portland, OR (US); Noriyuki Sato, Hillsboro, OR (US); Charles Wallace, Portland, OR (US); Jinnie Aloysius, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 17/671,543

(22) Filed: Feb. 14, 2022

(65) Prior Publication Data
US 2022/0173034 A1    Jun. 2, 2022

Related U.S. Application Data

(63) Continuation of application No. 16/562,346, filed on Sep. 5, 2019, now Pat. No. 11,251,117.

(51) Int. Cl.
*H01L 21/768*    (2006.01)
*H01L 23/522*    (2006.01)
(Continued)

(52) U.S. Cl.
CPC .... *H01L 23/5226* (2013.01); *H01L 21/76802* (2013.01); *H01L 21/76877* (2013.01);
(Continued)

(58) Field of Classification Search
CPC ........................ H01L 21/76807; H01L 21/768
See application file for complete search history.

(56) References Cited

U.S. PATENT DOCUMENTS

| 10,189,705 B1 | 1/2019 | Campanella Pineda et al. |
| 2002/0140101 A1* | 10/2002 | Yang ................. H01L 21/76807 257/762 |

(Continued)

FOREIGN PATENT DOCUMENTS

| JP | 2009514187 A | 4/2009 |
| JP | 2010171291 A | 8/2010 |

(Continued)

OTHER PUBLICATIONS

Final Office Action from U.S. Appl. No. 16/562,346 notified Jul. 8, 2021, 18 pgs.
(Continued)

*Primary Examiner* — Christopher A Johnson
(74) *Attorney, Agent, or Firm* — Essential Patents Group, LLP

(57) ABSTRACT

An integrated circuit interconnect structure includes a first metallization level including a first metal line having a first sidewall and a second sidewall extending a length in a first direction. A second metal line is adjacent to the first metal line and a dielectric is between the first metal line and the second metal line. A second metallization level is above the first metallization level where the second metallization level includes a third metal line extending a length in a second direction orthogonal to the first direction. The third metal line extends over the first metal line and the second metal line but not beyond the first sidewall. A conductive via is between the first metal line and the third metal line where the conductive via does not extend beyond the first sidewall or beyond the second sidewall.

20 Claims, 17 Drawing Sheets

(51) Int. Cl.
*H01L 23/528* (2006.01)
*H01L 29/417* (2006.01)
*H01L 29/423* (2006.01)

(52) U.S. Cl.
CPC .... *H01L 21/76885* (2013.01); *H01L 23/5283* (2013.01); *H01L 29/41725* (2013.01); *H01L 29/4232* (2013.01)

(56) References Cited

U.S. PATENT DOCUMENTS

| | | |
|---|---|---|
| 2010/0009554 A1 | 1/2010 | Ryu et al. |
| 2012/0326313 A1 | 12/2012 | Uzoh et al. |
| 2015/0206823 A1* | 7/2015 | Lin .................. H01L 21/76877 438/643 |
| 2018/0151496 A1 | 5/2018 | Biswas et al. |
| 2019/0198627 A1 | 6/2019 | Then et al. |
| 2020/0176380 A1* | 6/2020 | Chen ................ H01L 21/76898 |
| 2020/0402902 A1 | 12/2020 | Boscher et al. |

FOREIGN PATENT DOCUMENTS

| | | |
|---|---|---|
| TW | 201931526 | 8/2019 |
| WO | 2015047318 A1 | 4/2015 |

OTHER PUBLICATIONS

Non-Final Office Action from U.S. Appl. No. 16/562,346 notified Dec. 31, 2020, 17 pgs.

Notice of Allowance from U.S. Appl. No. 16/562,346 notified Oct. 22, 2021, 8 pgs.

Restriction Requirement from U.S. Appl. No. 16/562,346 notified Oct. 6, 2020, 7 pgs.

Office Action from Taiwanese Patent Application No. 109121112 notified Jan. 18, 2024, 28 pgs.

Office Action from Japanese Patent Application No. 2020-105544 notified Jun. 21, 2024, 18 pgs.

* cited by examiner

200

```
┌─────────────────────────────────────────────────────────────────┐
│ Form a plurality of metal lines, where each metal line is       │
│ separated by a dielectric                                       │
│ 210                                                             │
└─────────────────────────────────────────────────────────────────┘
                                 │
                                 ▼
┌─────────────────────────────────────────────────────────────────┐
│ Form a stack of polymer structures selectively on each of the   │
│ plurality of metal lines                                        │
│ 220                                                             │
└─────────────────────────────────────────────────────────────────┘
                                 │
                                 ▼
┌─────────────────────────────────────────────────────────────────┐
│ Form a stack of dielectrics adjacent to the stack of polymer    │
│ structures                                                      │
│ 230                                                             │
└─────────────────────────────────────────────────────────────────┘
                                 │
                                 ▼
┌─────────────────────────────────────────────────────────────────┐
│ Remove stack of polymer structures and form a mesh structure    │
│ including the stack of dielectrics and a dielectric orthogonal  │
│ to the stack of dielectrics                                     │
│ 240                                                             │
└─────────────────────────────────────────────────────────────────┘
                                 │
                                 ▼
┌─────────────────────────────────────────────────────────────────┐
│ Pattern the mesh in select locations to expose underlying       │
│ metal lines                                                     │
│ 250                                                             │
└─────────────────────────────────────────────────────────────────┘
                                 │
                                 ▼
┌─────────────────────────────────────────────────────────────────┐
│ Form via structures on metal lines and a second plurality of    │
│ metal lines in a direction orthogonal to a direction of the     │
│ first plurality of metal lines                                  │
│ 260                                                             │
└─────────────────────────────────────────────────────────────────┘
```

FIG. 2

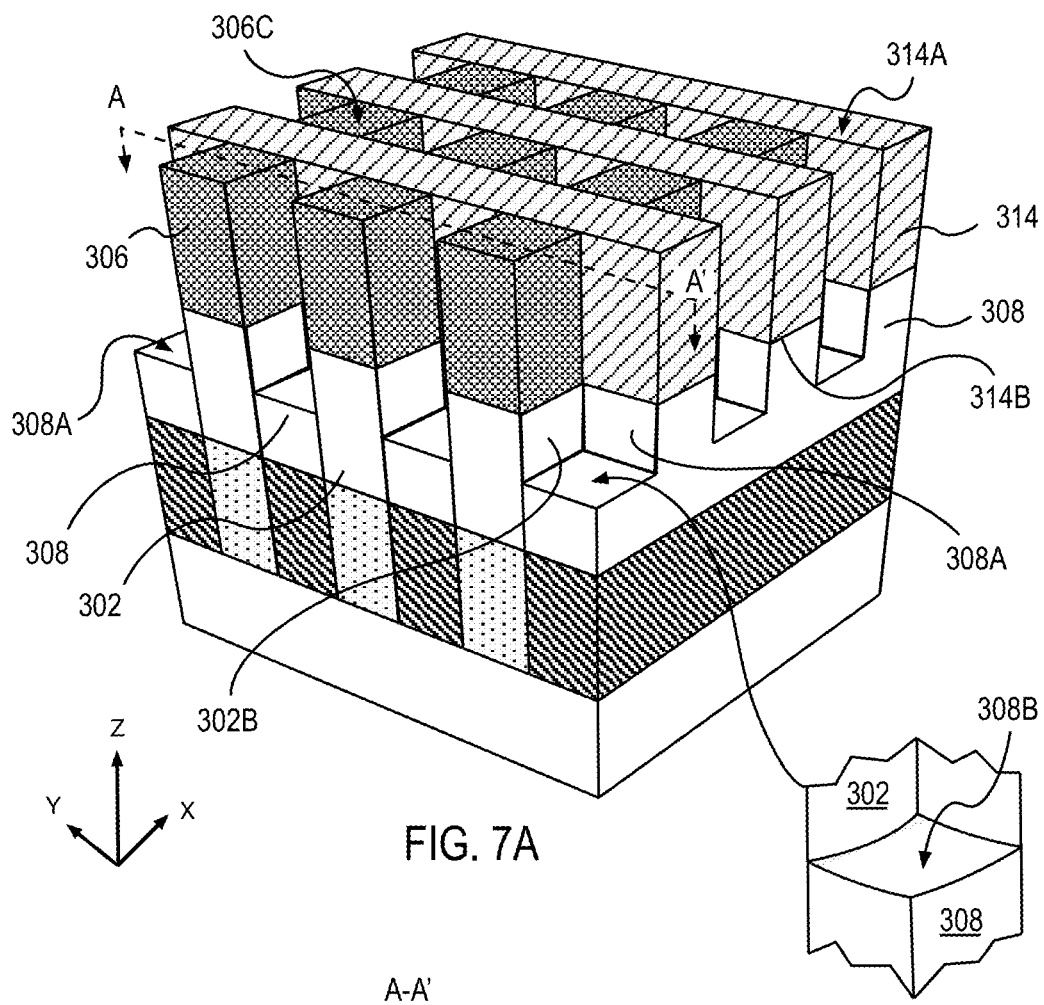
FIG. 7A
FIG. 7C
A-A'
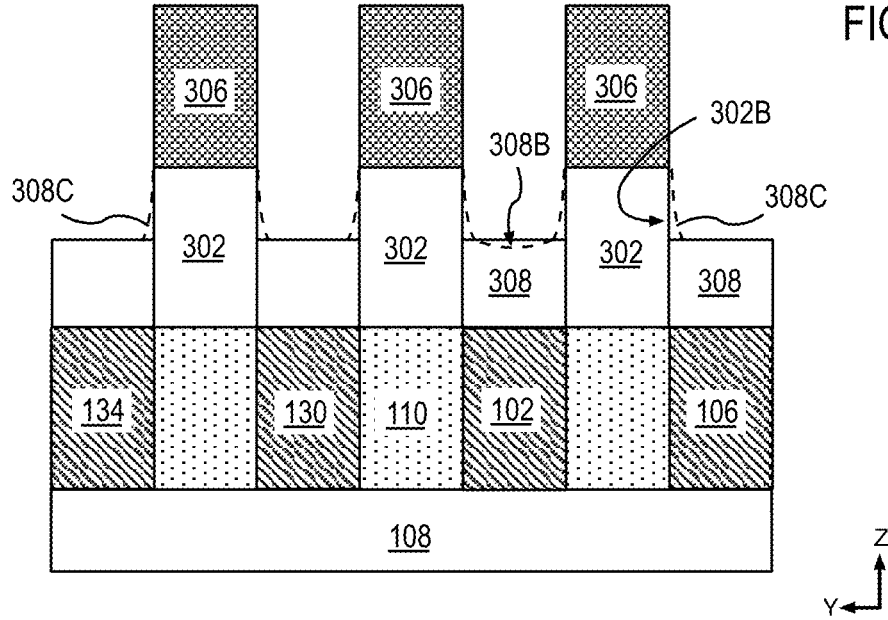
FIG. 7B

SELF ALIGNED GRATINGS FOR TIGHT PITCH INTERCONNECTS AND METHODS OF FABRICATION

CLAIM OF PRIORITY

This application is a continuation of, and claims the benefit of priority to, U.S. patent application Ser. No. 16/562,346, filed on Sep. 5, 2019 and titled "SELF ALIGNED GRATINGS FOR TIGHT PITCH INTERCONNECTS AND METHODS OF FABRICATION," which is incorporated by reference in entirety.

BACKGROUND

Transistor scaling requires precision alignment between various elements of interconnect circuitry to avoid shorting or prevent erroneous wiring. Limitations in alignment with conventional lithographic methods may be overcome by utilizing self-assembly methods and self-alignment between structures such as interconnect line segments and vias within a single die and within the wafer.

It is with respect to these and other considerations that the present improvements are needed. Such improvements may become critical with increased need for fabrication of high-density high-performance transistors.

BRIEF DESCRIPTION OF THE DRAWINGS

FIG. 2 illustrates a flow diagram for a method to fabricate an integrated circuit interconnect structure, in accordance with an embodiment of the present disclosure.

FIG. 7A illustrates an isometric view of the structure of FIG. 6A following the process to remove the sacrificial layer and recess portions of the third dielectric.

FIG. 7B illustrates a cross-sectional view through a line A-A' of the structure in FIG. 7A following the process to remove the sacrificial layer and recess portions of the third dielectric.

FIG. 7C illustrates an enhanced isometric view of a portion of the structure in FIG. 7A following the process to planarize the sacrificial layer and the second dielectric, depicting a surface that is curved due to the etch process.

DESCRIPTION OF THE EMBODIMENTS

Figure 1A:
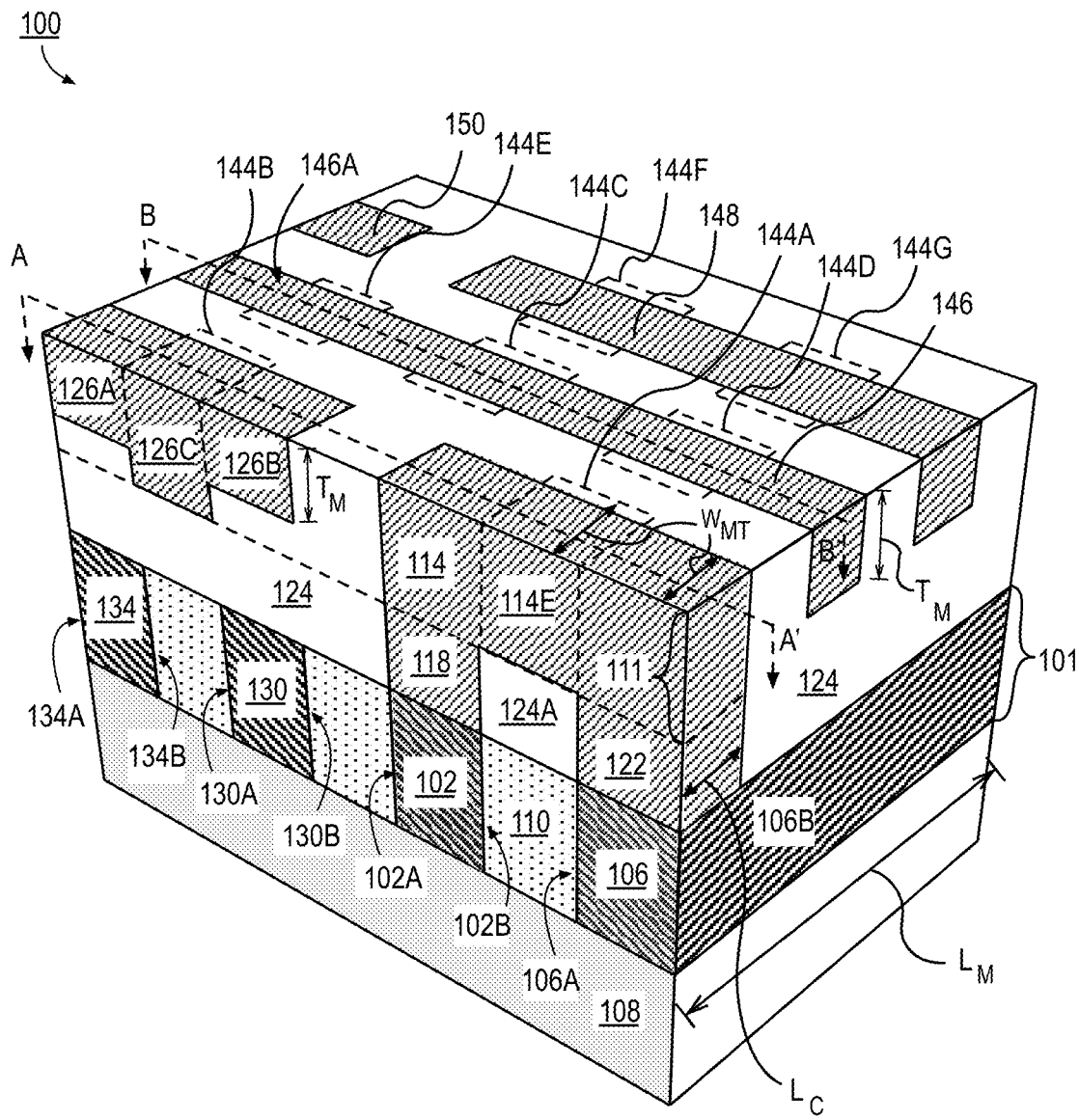
FIG. 1A illustrates an isometric view of an integrated circuit interconnect structure, in accordance with an embodiment of the present disclosure.

An integrated circuit interconnect structure and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

The integrated circuit interconnect structure is an intervening substrate used to bridge a first substrate to a second substrate. The first substrate may be, for instance, an integrated circuit die including one or more transistors. The second substrate may be, for instance, a memory module, a computer mother, or another integrated circuit die. Generally, the purpose of an integrated circuit interconnect structure is to spread a connection to a wider pitch or to reroute a connection to a different connection. For example, an integrated circuit interconnect structure may couple an integrated circuit die to one or more transistors that can subsequently be coupled to the second substrate. In some embodiments, the first and second substrates are attached to opposing sides of the integrated circuit interconnect structure. In other embodiments, the first and second substrates are attached to a same side of the integrated circuit interconnect structure.

Scaling of transistors in an integrated circuit die, for example, may enable high density logic and memory applications. However, as transistors are scaled, optimizing spacing and connectivity between transistors and peripheral circuit becomes challenging. Routing multiple levels of interconnects (lines and vias) requires precise alignments. Because patterning is accomplished through lithographic means, misalignment in one location is transferred evenly throughout the die. Misalignment can result in placement errors where vias can short to the wrong metal lines when the pitch between metal lines is reduced to 40 nm or less, for example. One way to deal with alignment is to shrink the size of vias and lines relative to each other and relative to transistor dimensions. However, when transistors are scaled to dimensions of 10 nm or less, shrinking lines further is even more challenging. Furthermore, reducing line width without engineering materials, for example, can increase electrical line resistance, which is disadvantageous from a standpoint of electrical power consumption.

However, this situation may be mitigated by replacing a conventional lithographic technique with a combination of directed self-assembly and damascene methods to form integrated circuit interconnect structures that can be coupled to one or more transistors. This combination of methods can enable self-alignment between two or more layers of metal lines, plugs or conductive vias between two substrates. More importantly, the shape and size of the lines and conductive vias above a lowermost level of metal lines may also be controlled so that conductive vias for example do not extend beyond sidewalls of metal lines below. Hence, not only are misalignment and problems associated with misalignment mitigated, but the feature sizes of the lines, plugs (line ends) or conductive vias may also be predetermined.

FIG. 1A illustrates an isometric view of an integrated circuit interconnect structure 100, in accordance with an embodiment of the present disclosure. In an exemplary embodiment, the integrated circuit interconnect structure 100 includes a first metallization level 101 including a first metal line 102 having a first sidewall 102A and a second sidewall 102B extending a length in the X-direction. The metallization level 101 further includes a second metal line 106 adjacent to the first metal line. A dielectric 110 is between the first metal line 102 and the second metal line 106. The metallization level 101 is above a substrate 108.

The integrated circuit interconnect structure 100 further includes a second metallization level 111 above the first metallization level 101. The metallization level 111 includes a third metal line 114, extending a length in the Y-direction, over the metal line 102 and the metal line 106. As shown, the metal line 114 has a sidewall 114A that does not extend beyond the first sidewall 102A. In the illustrative embodiment, the metal line 114 has a sidewall 114B that does not extend beyond the sidewall 106B. A conductive via 118 is between the metal line 102 and the metal line 114. As shown the conductive via 118 does not extend beyond the sidewall 102A or sidewall 102B.

The integrated circuit interconnect structure 100 further includes a second conductive via 122 between the metallization level 101 and the metallization level 111. As shown, the second conductive via 122 does not extend beyond a first sidewall 106A or a second sidewall 106B of the second metal line 106. In the illustrative embodiment, the conductive via 122 is in contact with a portion of the metal line 106 in the X-direction. The metal line 106 has a length $L_M$ (in the X-direction). The conductive via 122 extends a length, $L_C$, in the X-direction, that is a fraction of $L_M$, as shown. The metal line 102 also has a length $L_M$ along the X-direction (not shown in Figure) and conductive via 118 also extends a length, $L_C$, in the X-direction, that is a fraction of $L_M$.

The metal line 114 may be aligned with the vias 122 and 118 along the X direction. The metal line 114 has a width, $W_{MT}$ along the X-direction as shown. In some embodiments $W_{MT}$ is substantially equal to $L_C$ and in other embodiments, $W_{MT}$ is greater than or less that $L_C$. It is desirable to have $L_C$ be substantially equal to a width, $W_{MT}$ of the metal line 114 to optimize electrical resistance of via 122.

Figure 1B:
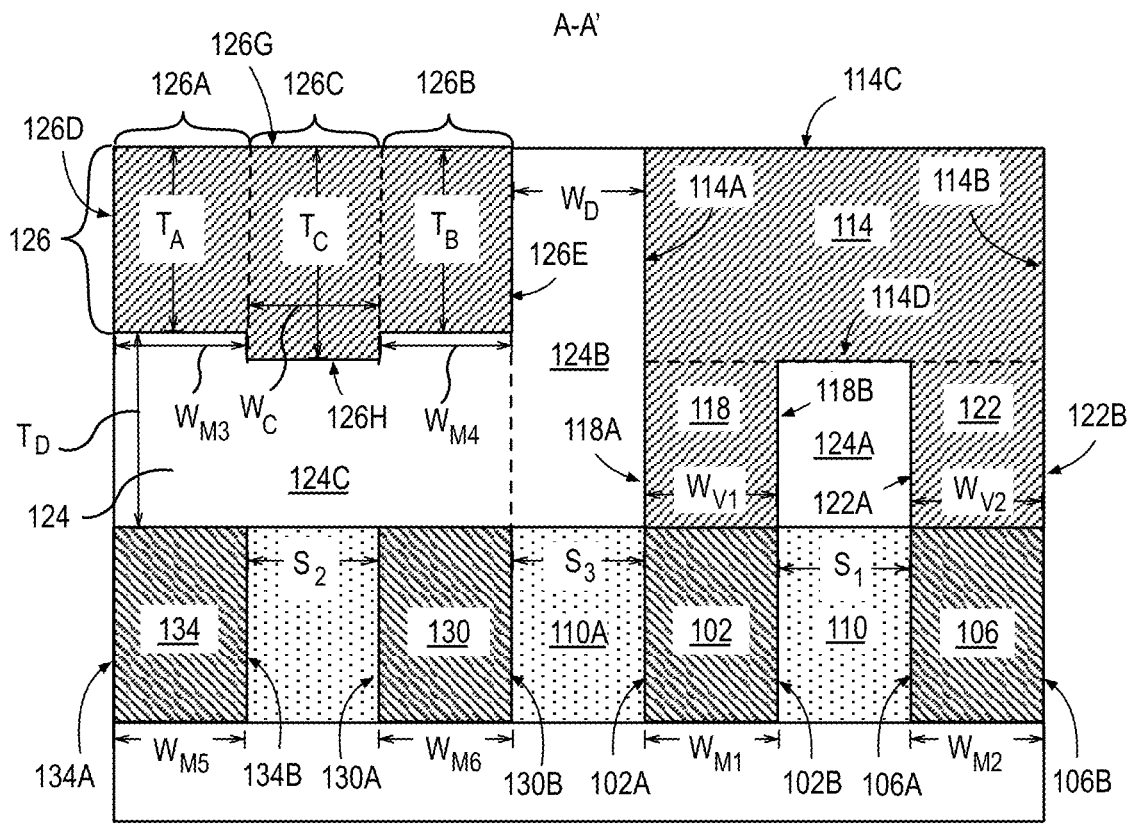
FIG. 1B illustrates a cross-sectional view of the integrated circuit interconnect structure in FIG. 1A.

FIG. 1B is a cross sectional illustration taken across the face of the integrated circuit interconnect structure 100 (along line A-A') in FIG. 1A. In general, lateral widths and spacing between the metal lines 102 and 106 may be indicative of a directed self-assembly process utilized to fabricate the integrated circuit interconnect structure 100. The metal line 102 has a lateral width, $W_{M1}$, and the metal line 106 has a lateral width, $W_{M2}$, as shown. $W_{M1}$ may be equal to or unequal to $W_{M2}$. In the illustrative embodiment, $W_{M1}$ is equal to $W_{M2}$. $W_{M1}$ may range between 5 nm to 50 nm and $W_{M2}$ may range between 5 nm to 50 nm. In exemplary embodiments, $W_{M1}$ and $W_{M2}$ vary by at most 10% from each other.

Parameters such as spacing between interconnects associated with transistors or other circuit elements and/or the directed self-assembly process utilized may determine a spacing S between the metal lines 102 and 106. In some embodiments, $S_1$ is between 5 nm and 50 nm. In exemplary embodiments, $S_1$ ranges between 0-10% of $W_{M1}$ and $W_{M2}$.

The conductive vias 118 and 122 have lateral widths (in the Y-direction) that are correlated with lateral widths of the metal lines 102 and 106, respectively. In general, the lateral widths of conductive vias 118 and 122 are at most equal to the lateral widths of the metal lines 102 and 106, respectively. As illustrated in FIG. 1B, the conductive via 118 has a lateral width, $W_{V1}$ and the conductive via 122 has a lateral width, $W_{V2}$. As discussed above, and as shown in FIG. 1B, $W_{V1}$, is substantially equal to $W_{M1}$, and $W_{V2}$ is substantially equal to $W_{M2}$. A second dielectric 124 includes a dielectric portion 124A above the dielectric 110 and between the conductive vias 118 and 122. As shown, the dielectric portion 124A has a width that is substantially equal to a width of the dielectric 110 (along the Y-direction). The dielectric 110 between the conductive vias 118 and 122 has a width that is also substantially equal to the spacing, $S_1$.

Referring again to FIG. 1A, in the illustrative embodiment, the metallization level 111 further includes a metal line 126 extending a length in the Y-direction over a metal line 130 and a metal line 134, where the metal line 130 and the metal line 134 are in the first metallization level 101. As shown, the metal line 130 has sidewalls 130A and 130B extending a length in the X-direction and the metal line 134 has sidewalls 134A and 134B also extending a length in the X-direction.

Referring to again to FIG. 1B, the metal line 126 extends laterally in the Y-direction from above the sidewall 134A to sidewall 130B. As shown, metal line 126 has a first portion 126A, a second portion 126B and a third portion 126C between the first portion 126A and the second portion 126B (herein metal line portion 126A, 126B or 126C). The different metal line portions 126A, 126B or 126C may have differing lateral thicknesses (in Y direction) and differing vertical thicknesses (in Z-direction). Differing thicknesses may be indicative of processing techniques utilized to form the metal line 126.

It is to be appreciated that metal line portions 126A and 126B each have a width $W_{M3}$, and $W_{M4}$, (in the Y-direction) that is substantially the same as the width, $W_{M5}$, and $W_{M6}$, of the metal lines 134 and 130, respectively. In some embodiments, such as is shown, $W_{M3}$, $W_{M4}$, $W_{M5}$, and $W_{M6}$ are substantially the same. $W_{M5}$ may range between 5 nm to 50 nm and $W_{M6}$ may range between 5 nm to 50 nm. In some embodiments, $W_{M1}$, $W_{M2}$, $W_{M5}$ and $W_{M6}$ each range between 5 nm to 50 nm. In exemplary embodiments, $W_{M5}$ and $W_{M6}$ vary by at most 10% from each other.

In some examples, metal line portion 126A has a sidewall 126D that is substantially aligned with sidewall 134A, and metal line portion 126B has a sidewall 126E that is substantially aligned with sidewall 130B. As shown metal line portion 126A does not extend beyond sidewall 134B and metal line portion 126B does not extend beyond sidewall 130A. As shown, the metal line portion 126C does not extend over the metal line 130 or metal line 134. The metal line portion 126C has a lateral width, $W_C$, that is substantially equal to a spacing, $S_2$, between the metal lines 130 and 134. $W_C$ may range between 5 nm to 50 nm. In some examples, the metal line portion 126C has a midpoint (along the lateral width, $W_C$) that is directly above a point midway between sidewalls 130A and 134B. In exemplary embodiments, $S_2$ ranges between 0-10% of $W_{M5}$ and $W_{M6}$.

In some examples, such as in the example illustrated, metal line 126 has a vertical thickness (in Z-direction relative to uppermost surface 126G) that varies along the Y-direction. Metal line portions 126A and 126B have a vertical thickness, $T_A$ and $T_B$, respectively. In some examples, $T_A$ and $T_B$ are substantially equal, such as is shown. The metal line portion 126C has a vertical thickness, $T_C$. In some examples, $T_A$ and $T_B$ are substantially equal to $T_C$. In other examples, $T_C$ is greater than $T_A$ and/or $T_B$, as illustrated. In some embodiments, $T_C$ is less than $T_A$ and/or $T_B$. An increased vertical thickness of the metal line portion 126C in the Z direction may provide an electrical benefit through an overall increased conductivity of the metal line 126.

Referring the metal line 114, there is no variation in a vertical thickness (relative to an uppermost surface 114C) along the Y-direction. In the illustrative embodiment, the metal line 114 has a lowermost surface 114D that is substantially co-planar with a lowermost surface 126H of the metal line portion 126C. Additionally, the uppermost surface 114C of the metal line 114 is substantially co-planar with the uppermost surface 126G of the metal line 126.

The dielectric 124 has a dielectric portion 124B above a dielectric portion 110A. As shown, the dielectric portion 124B occupies the space between the metal line portion 126B and metal line 114. The dielectric portion 124B has a lateral width, $W_D$. In the illustrative embodiment, $W_D$ does not vary along the Z-direction and is substantially equal to a spacing, $S_3$, between the metal line 102 and metal line 130.

The dielectric 124 also includes a dielectric portion 124C that is directly between the metal line portions 126A, 126B and 126C, and the metal line 134, metal line 130 and dielectric 110, respectively. The dielectric portion 124C has a vertical thickness $T_D$, that varies along the Y-direction. In the illustrative embodiment, the dielectric portion 124C has a smallest vertical thickness, $T_D$ between the metal line 126C and the dielectric 110. Additionally, the dielectric portion 124A between conductive via 118 and 122 has a vertical thickness $T_D$ that is substantially the same as the vertical thickness of the dielectric portion 124C between the metal line 126C and the dielectric 110.

Figure 1C:
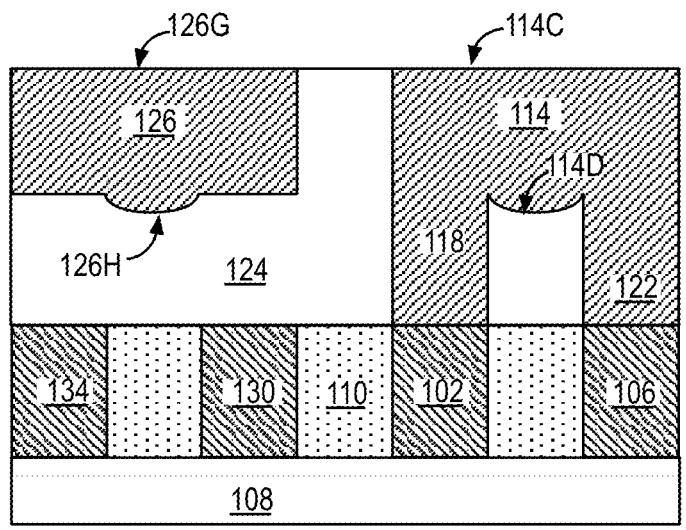
FIG. 1C illustrates a cross-sectional view of an integrated circuit interconnect structure.

In other embodiments, the lowermost surface 126H of the metal line 126 and lowermost surface 114C of the metal line 114 may not be planar. FIG. 1C is a cross sectional illustration of the structure in FIG. 1B where the lowermost surfaces 126H and 114C are substantially curved. A curved surface is indicative of a processing operation utilized to form the metal lines 126 and 114. Such curved surfaces may be indicative of specific processing techniques utilized as will be discussed further below. In the illustrative embodiment, lower most portions of surfaces 126H and 114D are at a substantially same level with respect to the uppermost surfaces 126G and 114C, respectively, where uppermost surfaces 126G and 114C are substantially co-planar.

Figure 1D:
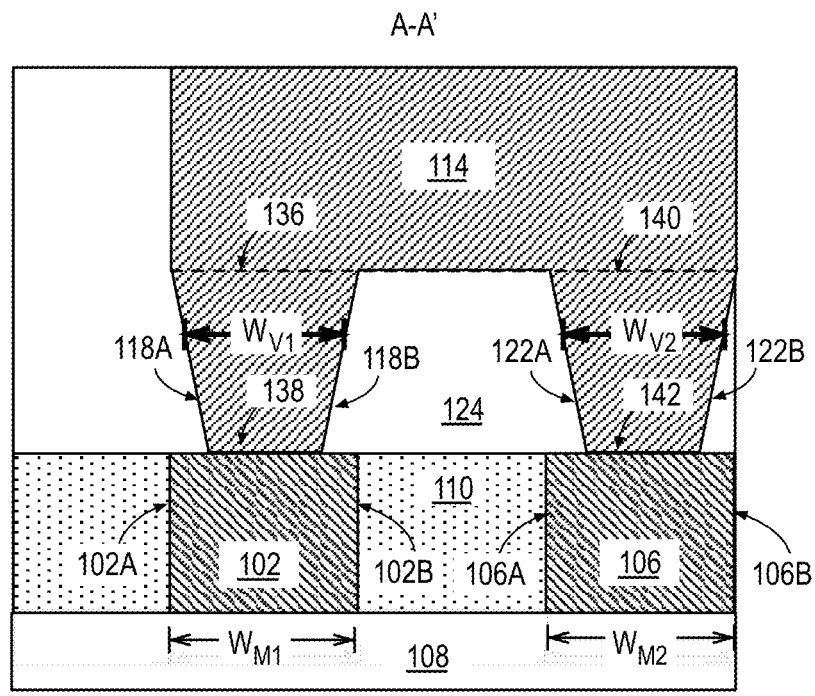
FIG. 1D illustrates a cross-sectional view of an integrated circuit interconnect structure.

In some examples, sidewalls 118B and 118A or sidewalls 122B and 122A are not substantially vertical as those illustrated in FIG. 1B or 1C. FIG. 1D is a cross-sectional illustration of a portion of the integrated circuit interconnect structure 100 depicted in FIG. 1B. In some such examples, the lateral width, $W_{V1}$ decreases along the Z-direction. As shown, the lateral width, $W_{V1}$ decreases from a maximum lateral width at an interface 136 between the metal line 114 and conductive via 118 to a minimum lateral width at an interface 138 between the metal line 102 and conductive via 118. In the illustrative embodiment, the lateral width, $W_{V1}$, at the interface 136 is substantially equal to the lateral width, $W_{M1}$ of the metal line 102. As shown, the sidewalls 118A and 118B have a substantially similar slant with respect to the interface 138. Also as shown, the sidewalls 118A and 118B do not extend beyond the sidewalls 102A and 102B, respectively.

In an embodiment, the lateral width, $W_{V2}$ decreases along the Z-direction. As shown lateral width, $W_{V2}$ decreases from a maximum lateral width at an interface 140 between the metal line 114 and conductive via 122 to a minimum lateral width at an interface 142 between the metal line 106 and conductive via 122. In the illustrative embodiment, the lateral width, $W_{V2}$, at the interface 140 is substantially equal to the lateral width, $W_{M2}$ of the metal line 106. As shown, the sidewalls 122A and 122B have a substantially similar slant with respect to the interface 142. Also as shown, the sidewalls 122A and 122B do not extend beyond the sidewalls 106A and 106B, respectively. In exemplary embodiments, sidewalls 122A and 122B have substantially similar slants as sidewalls 118A and 118B, respectively.

In other embodiments, (not shown) the metal lines 102 and 106 may be tapered where a maximum width of the metal lines 102 and 106 are at the interfaces 138 and 142, respectively. In such examples, a maximum lateral width, $W_{V1}$, of the conductive via 118 at interface 136 is substantially equal to a maximum lateral width, $W_{M1}$ of the metal line 102 at interface 138. In a further such example, a maximum lateral width, $W_{V2}$, of conductive via 122 at interface 140 is substantially equal to a maximum lateral width, $W_{M2}$ of the metal line 106 at the interface 142.

When the lateral widths, $W_{V1}$ and $W_{V2}$ at interfaces 138 and 142 are less than $W_{M1}$ and $W_{M2}$, the dielectric portion 124 is in contact with portions of the metal lines 102 and 106. As shown, dielectric 124 is in direct contact with a portion of an uppermost surface 102C of the metal line 102 and in direct contact with a portion of an uppermost surface 106C of the metal line 106. in direct contact Referring again to FIG. 1A, in some examples, the metal lines in the metallization level 111 have lateral widths that vary in the X-direction. Such variations may be periodic and align with portions of dielectric 110 in the integrated circuit interconnect structure 100. In the illustrative embodiment, metal line 114 has a portion 114E (in dashed line 144A) having a greater width $W_{MT}$ than remaining portions of the metal line 114. As shown, the portion 114E is directly above the dielectric portion 124A and dielectric 110. As shown, the portion of the metal line 114 having a greater width $W_{MT}$ is also not above the metal lines 102 or 106.

In an embodiment, metal line portion 126C has a width $W_{MT}$ (inside dashed line 144B) that is greater than the width $W_{MT}$ of metal line portions 126A or 126B. The metal line portion 126C is also directly above the dielectric 110. It is to be appreciated that, in some embodiments, the width, $W_{MT}$, of the metal line portions 114E and 126C are substantially similar. As shown, the portion of the metal line 126 having a greater width $W_{MT}$ is also not above the metal lines 130 or 134. In other examples, even when each metal line portions 126A, 126B and 126C have a single thickness $T_M$, metal line portion 126C may still have a width, $W_{MT}$, (inside dashed line 144B) that is greater than the width, $W_{MT}$, of metal line portions 126A or 126B.

In some examples, a metal line, such as metal line 146 in the metallization level 111 can extend over more than two metal lines in the first metallization level 101. In the illustrative embodiment, the metal line 146 has a thickness, $T_M$, that varies relative to an uppermost surface 146A across a face of the metal line in the Y-direction. The metal line 146 is located on a plane behind a plane of the metal line 126, where the two planes are separated along the X-direction. In the illustrative embodiment, the plane of the metal line 126 is separated from the plane of the metal line 146 by one or more dielectric. The integrated circuit interconnect structure 100 further includes a metal line 148 and a metal line 150 on a plane behind the plane of the metal line 146.

In some embodiments, metal line 146 also has portions within dashed lines 144C, 144D and 144E where the lateral width, $W_{MT}$, is greater than other portions of the metal line 146. The metal line portions within dashed lines 144C, 144D and 144E also correspond to locations above the dielectric 110.

In some embodiment, metal line 148 also has portions within dashed lines 144F and 144G where the lateral width, $W_{MT}$, is greater than in other portions of the metal line 148. The metal line portions within dashed lines 144F and 144G also correspond to locations above the dielectric 110.

Depending on a layout of the integrated circuit interconnect structure 100, metal lines 146, 148 and 150 in the metallization level 111 may have one or more features of the metal lines 114 and 126.

Figure 1E:
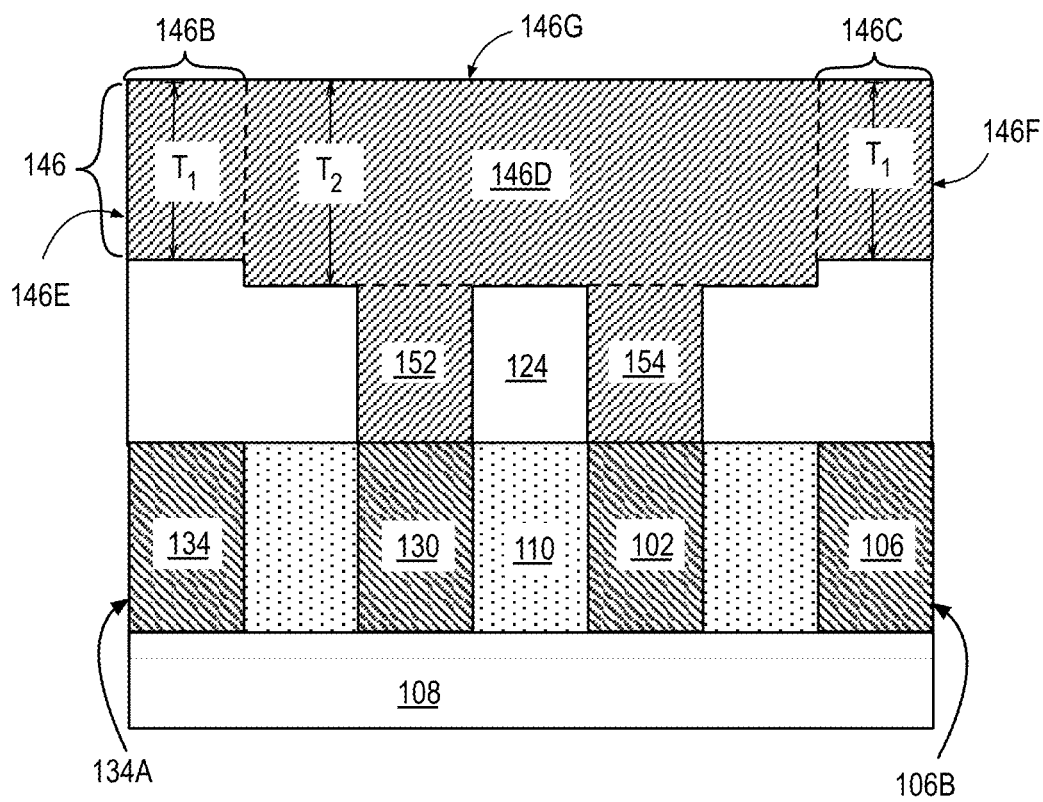
FIG. 1E illustrates a cross-sectional view of an integrated circuit interconnect structure.

FIG. 1E is a cross sectional illustration through the line B-B' in FIG. 1A. As shown the integrated circuit interconnect structure 100 includes a metal line 146 extending over metal lines 102, 106, 130 and 134. Metal line 146 includes a metal line portion 146B, 146C and a metal line portion 146D between portion 146B and 146C.

In various examples, the different portions of metal line 146 may have different thicknesses relative to an uppermost surface 146G. For example, as shown, metal line portions 146B and 146C each have a vertical thickness, $T_1$, and metal line portion 146C has a vertical thickness, $T_2$. In an embodiment, $T_1$ is less than $T_2$, as shown. The different vertical thicknesses maybe a result of a fabrication process. It is to be appreciated that $T_1$ and $T_2$ may be substantially the same as $T_A$ and $T_C$, respectively, depicted in FIG. 1B.

Referring again to FIG. 1E, in the illustrative embodiment, the metal line 146 has a sidewall 146E and a sidewall 146F extending along the X-direction (in to the page in the Figure). In some embodiments, the sidewall 146E does not extend beyond sidewall 134A and sidewall 146F does not extend beyond sidewall 106B. As shown, sidewall 146E is substantially aligned with sidewall 134A (in the Y-direction) and sidewall 146F is substantially aligned to sidewall 106B (also in the Y-direction).

As discussed above, a fabrication process including a DSA process may result in different vertical thickness (along Z-direction) of portions of the metal line 146. The DSA process may also be responsible for different metal line portions in metallization level 111 to extend over and align with distinct metal lines in the metallization level 101. For example, the metal line portion 146D extends over metal lines 130 and 102 but not over metal line 134 or over 106.

In some embodiments, metal line 146 may also be coupled with one or more conductive vias substantially similar to conductive via 118 or 122. In the illustrative embodiment, the metal line portion 146D is in contact with a conductive via 150 and a conductive via 152. The conductive vias 150 and 152 are each separately coupled with metal line 130 and metal line 102, respectively, in the metallization level 101, as shown. The conductive vias 150 and 152 are separated from each other in the Y-Z plane, by a portion of the dielectric 124. The conductive vias 150 and 152 each include one or more properties of the conductive vias 118 and 122, such as length and width (in the X and Y directions, respectively), height (in Z-direction) and material composition.

Referring again to FIG. 1A, in an embodiment, the metal lines 102, 106, 130 and 134 each include a same material. In some embodiment, the metal lines 102, 106, 130 and 134 include a liner layer and a fill metal on the liner layer. For example, the liner layer may include ruthenium or tantalum and the fill metal may include tungsten, cobalt, nickel or copper.

In an embodiment, the metal lines 114, 126, 146, 148 and 150 each include a same material. In some embodiment, the metal lines 114, 126, 146, 148 and 150 include a liner layer and a fill metal on the liner layer. For example, the liner layer may include ruthenium or tantalum and the fill metal may include tungsten, cobalt, nickel or copper. The metal lines 114, 126, 146, 148 and 150 may include a material that is different from the material of the metal lines 102, 106, 130 and 134.

Dielectric 110 includes silicon and at least one or more of oxygen, carbon or nitrogen, for example, $SiO_2$, SiOC, SiOCN, SiN or SiC.

In an embodiment, the substrate 108 includes a suitable semiconductor material such as but not limited to, single crystal silicon, polycrystalline silicon and silicon on insulator (SOI). In another embodiment, substrate 108 includes other semiconductor materials such as germanium, silicon germanium or a suitable group III-N or a group III-V compound. In other embodiments, substrate 108 includes silicon and at least one or more of oxygen, carbon or nitrogen, for example, SiO2, SiOC, SiOCN, SiN or SiC. In some examples, the substrate 108 includes a material that is substantially similar to a material of the dielectric 110. Logic devices such as MOSFET transistors and access transistors and may be formed on the substrate 108. Logic devices such as access transistors may be integrated with integrated circuit interconnect structure 100 and memory devices such as SOT memory devices to form embedded memory. Embedded memory including SOT memory devices and logic MOSFET transistors may be combined to form functional integrated circuit such as a system on chip.

FIG. 2 illustrates a flow diagram for a method to fabricate an integrated circuit interconnect structure, in accordance with an embodiment of the present disclosure. The method 200 begins at operation 210 by forming a plurality of metal lines above a substrate, where each line is separated by a dielectric. The method 200 continues at operation 220 with the formation of a stack of polymer structures selectively on each of the plurality of metal lines. The polymer structures have a substantially equal height and a lateral width that correlates with a lateral width of the metal lines. The method 200 continues at operation 230 with the formation of stack of dielectrics adjacent to the stack of polymer structures. The method 200 continues at operation 240 with the removal of the stack of polymer structure and the formation of a mesh structure including the first stack of dielectric and a second dielectric, orthogonally intersecting the first dielectric. The method 200 continues at operation 250 with etching of the dielectric mesh in select locations to expose underlying metal lines. The method concludes at operation 260 with the formation of via structures on portions of metal lines and a second plurality of metal lines in a direction orthogonal to a direction of the first plurality of metal lines.

Figure 3A:
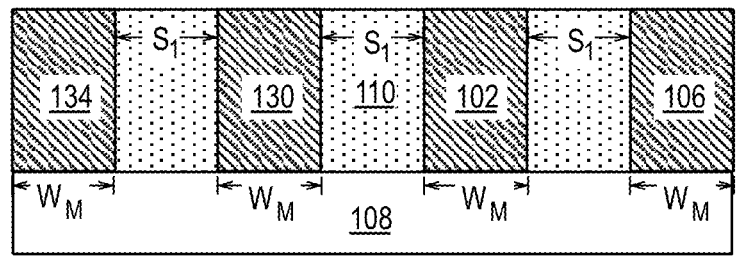
FIG. 3A illustrates a cross-sectional view of a plurality of metal lines formed above a substrate.

FIG. 3A illustrates a cross-sectional view following the formation of metal lines 102, 106, 130 and 134 formed above a substrate 108. In an embodiment, the metal lines 102, 106, 130 and 134 are formed using a damascene process by patterning a plurality of trenches in a dielectric 110. The metal lines may have substantially vertical sidewalls or be tapered. In the illustrative embodiment, the sidewalls 102A, 102B, 106A, 106B 130A, 130B, 134A and 134B are substantially vertical relative to an uppermost surface of the substrate 108. In the illustrative embodiment, the metal lines 106, 130 and 134 each have a substantially equal lateral width, $W_M$ and are uniformly spaced apart by a spacing, $S_1$. In some embodiments, $W_M$ and $S_1$ are substantially equal to each other to facilitate a direct self-assembly process to be described below.

Figure 3B:
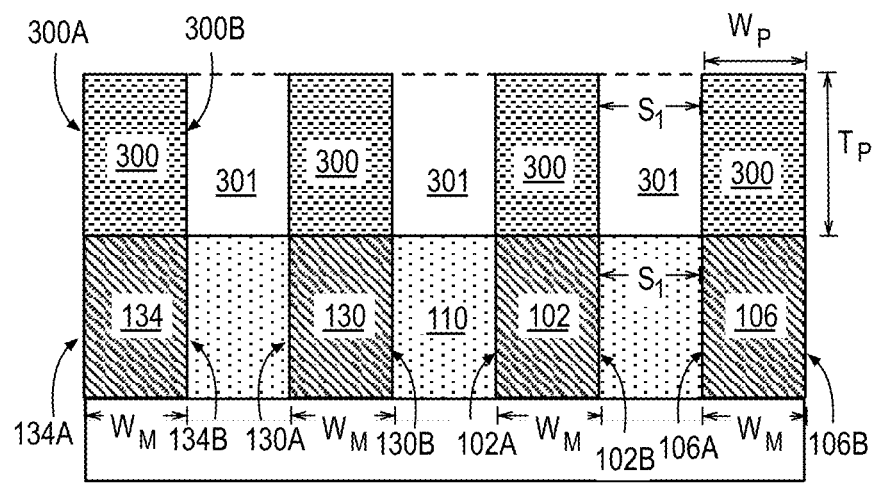
FIG. 3B illustrates the structure of FIG. 3A following the process to form a first set of polymer lines, where each polymer lines are in directly on each of the plurality of metal lines.

FIG. 3B illustrates the structure of FIG. 3A following the process to form a polymer line 300 selectively on each of the metal lines 102, 106, 130 and 134. The polymer lines 300 are formed by a directed self-assembly process, where a di-block copolymer is formed on the metal lines 102, 106, 130 and 134 and on the dielectric 110. A di-block copolymer includes a first polymer such as a polystyrene (PS) 300 and a second polymer, PMMA (inside dashed box 301), adjacent to the PS 300. In one embodiment, a wet chemical process is utilized to selectively remove the PMMA 301 with respect to the PS 300. In other embodiments, the PS 300 may be removed selectively relative to PMMA 301. Removal of PS 300 for example, may provide more flexibility in material selection above the metal lines 102, 106, 130 and 134.

As shown, the polymer line 300 is selectively formed on the metal lines 134, 130, 102 and 106, where the sidewalls 300A and 300B of each polymer line 300 are substantially aligned with sidewalls 102A and 102B, 106A and 106B, 130A and 130B, 134A and 134B, respectively. In the illustrative embodiment, the polymer line 300 does not extend over the dielectric 110.

The polymer line 300 has a vertical thickness $T_P$, and a width $W_P$, as illustrated. A ratio between $T_P$ and $W_P$ defines an aspect ratio, AR, of the polymer line 300. In embodiments, the AR of the polymer line ranges between 2:1 and 3:1, where $T_P$ is greater than $W_P$. It is to be appreciated that because $W_P$ of each polymer line 300 depends on lateral width, $W_M$, of each metal line 102, 106, 130 or 134, the aspect ratio of each polymer line 300 may vary depending on $W_M$. It is desirable for $W_M$ of each metal line to be of a single value to reduce variation in the aspect ratio of the polymer line 300. In some embodiments, $W_M$ may vary by up to 10% between each metal line 102, 106, 130 and 134 without appreciably affecting the aspect ratio of each polymer line 300 formed.

The spacing $S_1$ may also affect the aspect ratio. Because the di-block copolymer includes PMMA 301, the aspect ratio of the PMMA 301 ($T_P/S_1$) will depend on the spacing, $S_1$ and on the aspect ratio of the PS 300. It may be desirable to have a ratio close to 1:1 between $W_M$ and $S_1$ so that the aspect ratio of the PS 300 and the aspect ratio of the PMMA 301 are substantially equal. In some embodiments, the ratio between $W_M$ and $S_1$ may vary by up to 10%.

Figure 3C:
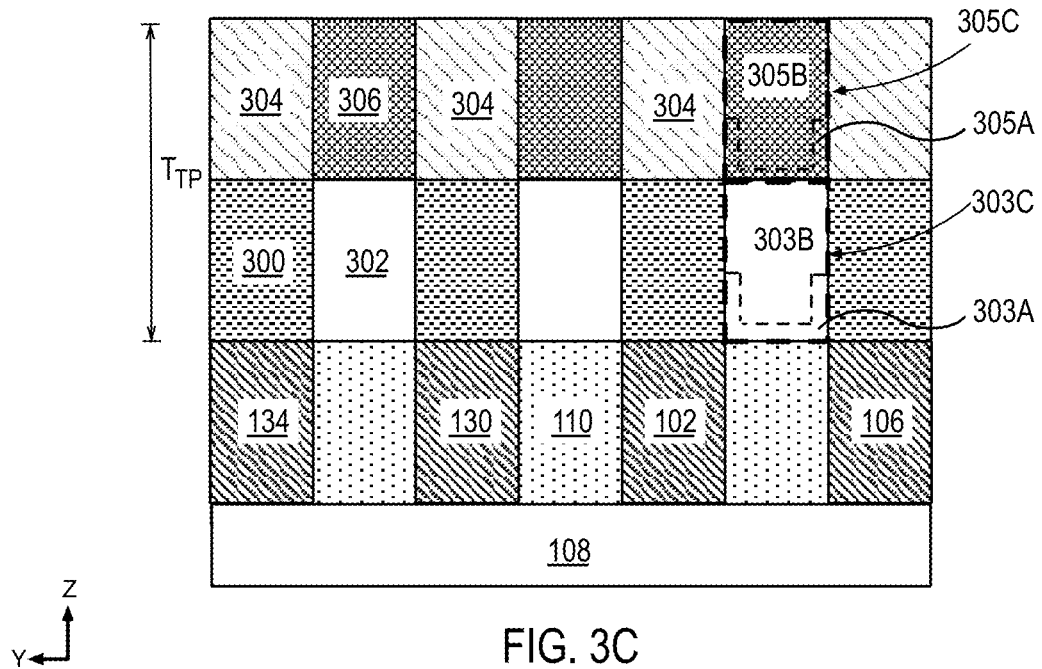
FIG. 3C illustrates a cross-sectional view of the structure of FIG. 3B following the process of forming a first dielectric adjacent to the first set of polymer lines and following the formation of a second set of polymer lines, where each polymer line in the second set of polymer lines is directly on each of the polymer lines in the first set of polymer lines, and following the formation of a second dielectric on the first dielectric and adjacent to the second set of polymer lines.

FIG. 3C illustrates a cross-sectional view of the structure of FIG. 3B following the process of forming a dielectric 302, a polymer line 304 on each dielectric 300, and dielectric 306.

In an embodiment, a dielectric 302 is formed adjacent to each polymer line 300. The dielectric may be formed at a sufficiently low temperature to prevent polymer line 300 from collapsing. In some embodiments, the dielectric 302 includes SiO2, SiOC, SiOCN, SiN, SiC. In some embodiments, the dielectric 302 is replaced by a thin hermetic liner 303A formed adjacent to the polymer 300 and a dielectric 303B formed on the hermetic liner 309A, as illustrated by the region inside dashed lines 303C. The hermetic liner may help reduce oxidation of the metal lines 102, 106, 130 and 134 and provide a hermetic etch stop. The thin hermetic liner 309A may include SiOCN, Al2O3, or HfO2 and the dielectric 303B includes a material of the single dielectric 302. The dielectric 302 may be deposited to fill the space between each polymer line 300. In other examples, the dielectric 302 may be blanket deposited and excess portions formed on polymer 300 may be removed by a planarization process, such as a chemical mechanical polish (CMP) process.

Since aspect ratio of the polymer lines 300 are determined by the metal lines 102, 106, 130 and 134, a second set of polymer lines may be formed on the first set of polymer lines 300, when a thicker polymer structure (in the Z-direction) is desired. A thicker polymer structure may be desired because metal lines and vias that will subsequently be formed upon removal of the polymer may need to have a minimum thickness to operate effectively. For example, to lower electrical capacitance, it is desirable to increase the total polymer thickness $T_{TP}$. By increasing $T_{TP}$ one or more taller conductive vias may be formed above metal lines 102, 106, 130 and/or 134. A taller conductive via can separate a metal line 102, 106, 130 or 134, for example, from a metal line to be formed on the taller conductive via. As a further example, to lower line resistance it is desirable to increase the total polymer thickness $T_{TP}$ to form a thicker metal line on one or more conductive vias formed above the metal lines 102, 106, 130 and/or 134.

In the illustrative embodiment, a second set of polymer lines 304 is formed on the first set of polymer lines 300.

Each polymer line 304 is aligned with each of the polymer line 300. The method to form the polymer lines 304 is substantially the same as the process utilized to form the polymer line 300. The dielectric 302 is exposed after the polymer lines 304 are formed.

A second dielectric 306 is formed on the dielectric 302. In an embodiment, the dielectric 306 includes a material that is different from a material of the dielectric 302. A different dielectric material enables selective removal and helps to increase tolerances during subsequent lithographic and etch operations. The dielectric 306 may be blanket deposited in the space between the polymer lines 304 by a plasma enhanced chemical vapor deposition (PECVD) or a chemical vapor deposition (CVD) process. In some embodiments, any excess dielectric 306 formed on the polymer lines 304 is removed by a planarization process. In some embodiments, a thin hermetic liner 305A including SiOCN, Al2O3, or HfO2 is formed adjacent to the polymer 300 before deposition of a dielectric. A dielectric 305B may be formed on the hermetic liner 305A as illustrated by the region inside dashed lines 305C. In an embodiment, the dielectric 305B includes a material of the dielectric 302.

Depending on embodiments, the process of forming dielectric between polymer lines and the process of forming an additional polymer line above a given polymer line can be repeated between 2-4 times.

Figure 3D:
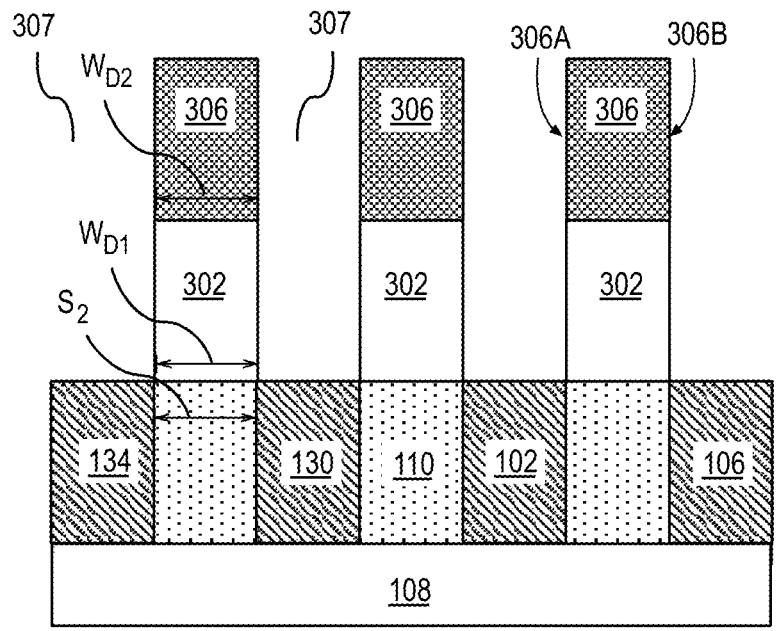
FIG. 3D illustrates a cross-sectional view of the structure of FIG. 3C following the removal of the first and second set of polymer lines.

FIG. 3D illustrates a cross-sectional view of the structure of FIG. 3C following the removal of the polymer lines 304 and 300. In an embodiment, a wet chemical process is utilized to remove the polymer lines 304 and 300 selectively to the metal lines 102, 106, 130 and 134, the dielectric 302, and 306. After removal of the polymer lines 300 and 304, a plurality of openings 307 is formed between the stack of dielectric 306 and dielectric 302. The stack of dielectric 306 and dielectric 302 have sidewalls that are substantially aligned. Lateral widths (in the Y-direction) of the dielectric 306 and dielectric 302 are substantially equal to a spacing, $S_1$. For example, the dielectric 302 has a width, $W_{D1}$, that is substantially the same as a width, $W_{D2}$ of the dielectric 306 and substantially equal to a spacing $S_2$, between the metal lines 134 and 130.

As shown, the sidewalls 306A and 306B of the dielectric 306 are substantially vertical with respect to the X and Y axis. The verticality of sidewalls 306A and 306B, for example, may determine whether sidewalls of metal lines to be subsequently formed in the opening 307 will align with sidewalls of the metal lines 102, 106.

Figure 3E:
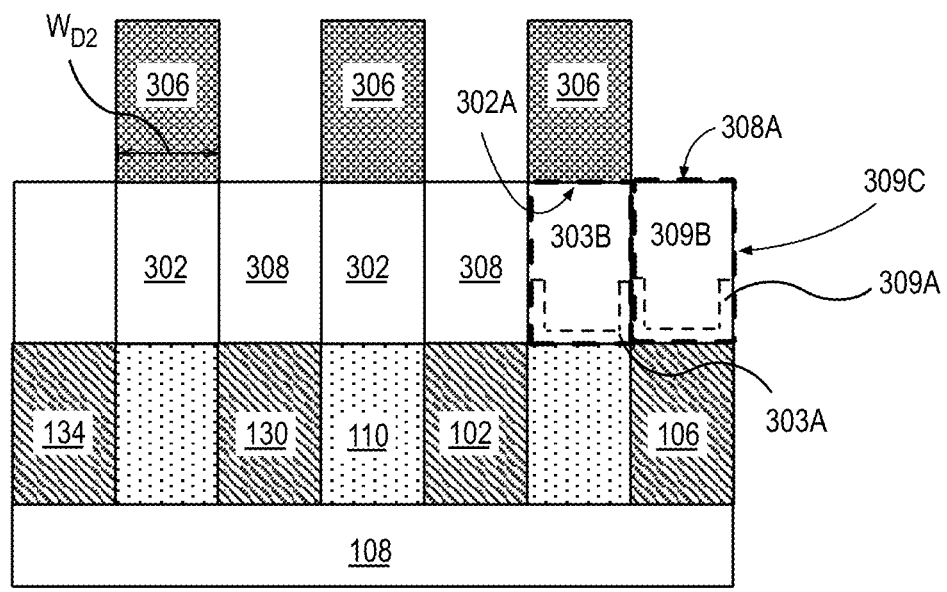
FIG. 3E illustrates a cross-sectional view of the structure of FIG. 3D following the formation of a third dielectric adjacent to the first dielectric.

FIG. 3E illustrates a cross-sectional view of the structure of FIG. 3D following the formation of a dielectric 308 on the metal lines 102, 106, 130 and 134 and adjacent to the dielectric 302. In an embodiment, the dielectric 308 includes a material that is the same or substantially the same as a material of the dielectric 302. In some such embodiments, the interfaces between 302 and 308 may not be resolvable. In other embodiments, depending on the material of dielectric 302 and 308 and spacing between each dielectric 302, some voids in dielectric 308 adjacent to dielectric 302 may be formed. The dielectric 308 may be blanket deposited in the plurality of openings 307, on the dielectric 306, adjacent to dielectric 302 and on the metal lines 102, 106, 130 and 134 by a CVD or a PECVD process. In an embodiment, the dielectric 308 includes a material of the dielectric 302.

In some embodiment, any excess dielectric 308 formed above the dielectric 306 may be removed by a planarization process. After the planarization process the dielectric 308 may be recessed by a wet chemical process selectively to the dielectric 306. During the recess of dielectric 308, the width, $W_{D2}$, remains unaltered or substantially unaltered. In an embodiment, the recess process forms an uppermost surface 308A of the dielectric 308 that is at a same level as an uppermost surface 302A of the dielectric 302. In other embodiments, surfaces 302A and 308A are not co-planar, for example surface 302A may be above or below surface 308A.

In some embodiments, a single dielectric 308 is replaced by a thin hermetic liner 309A formed adjacent to the dielectric 302 and a dielectric 309B formed on the hermetic liner 309A, as illustrated by the region inside dashed lines 309C. The thin hermetic liner 309A may include SiOCN, Al2O3, or HfO2 and the dielectric 309B includes a material of the dielectric 308. The thin hermetic liner 309A may or may not be adjacent to the dielectric 306. For example, in the illustrative embodiment, thin hermetic liner 309A is not adjacent to dielectric 306.

In embodiments where a single dielectric 302 is replaced by a thin hermetic liner 303A and a dielectric 303B on the thin hermetic liner 303A, hermetic liner 303A and hermetic liner 309A are directly adjacent to each other as illustrated.

Figure 4A:
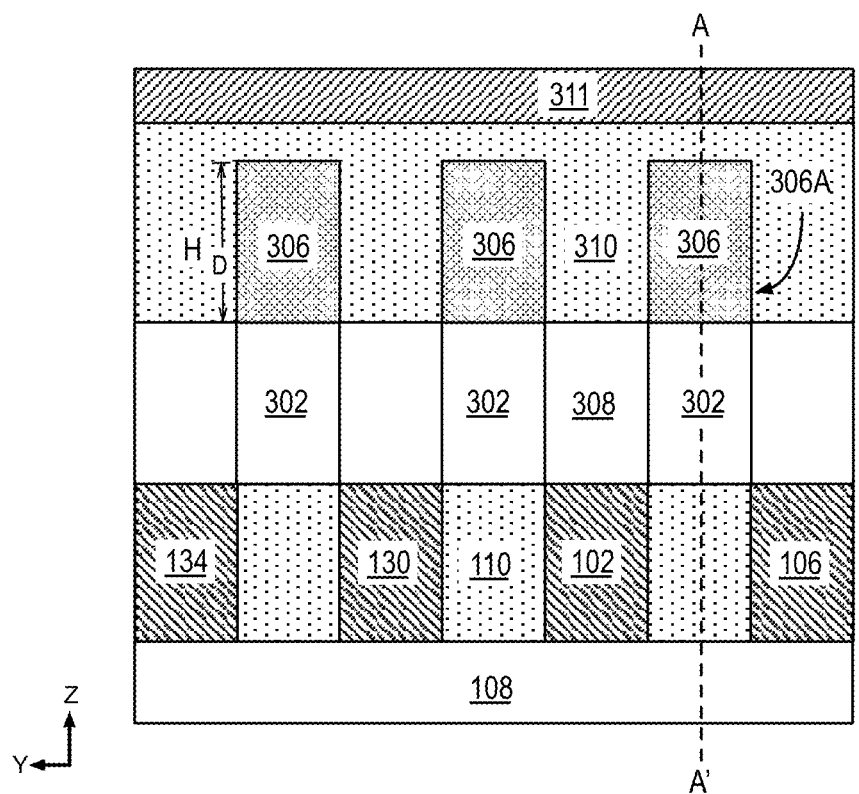
FIG. 4A illustrates a cross-sectional view of the structure in FIG. 3E following the formation of a sacrificial patterning layer adjacent to the second dielectric and a mask on the sacrificial layer.

FIG. 4A illustrates a cross-sectional view of the structure in FIG. 3E following of a sacrificial layer 310 adjacent to the dielectric 306 and on the dielectric 308, and a mask 311 on the sacrificial layer 310. In an embodiment, the sacrificial layer 310 includes silicon and one or more of carbon and oxygen. In the illustrative embodiment, the sacrificial layer 310 is formed to a thickness that exceeds a height, HD, of the dielectric 306. In some embodiments, the sacrificial layer 310 may be planarized after deposition. The mask 311 may be formed on the sacrificial layer 310 by a lithographic process.

Figure 4B:
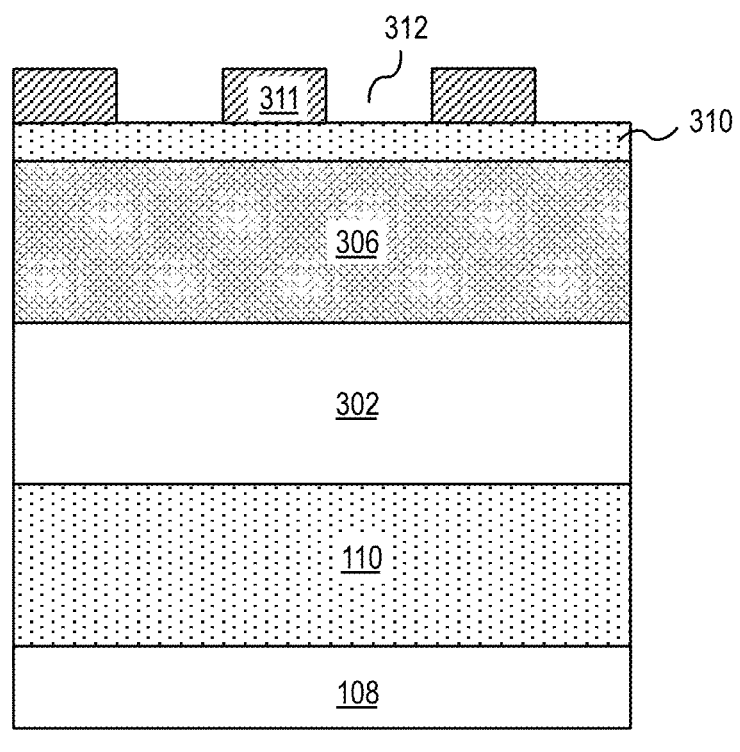
FIG. 4B illustrates a cross-sectional view orthogonal to a line A-A' in FIG. 4A.

FIG. 4B illustrates a cross-sectional view orthogonal to a line A-A' in FIG. 4A. The mask 311 is designed to form openings 312 that will define a length of metal lines and conductive vias to be subsequently formed. The dielectric 306 and 302 form lines in the X-direction as shown.

Figure 5A:
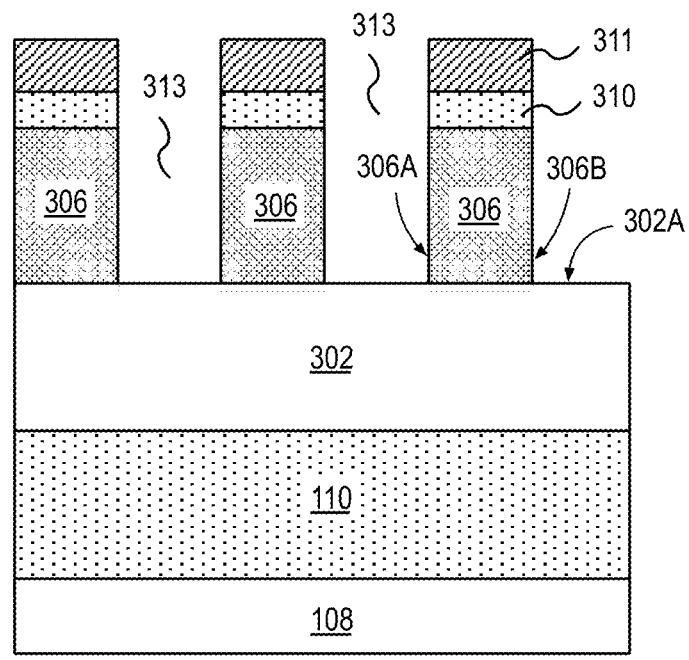
FIG. 5A illustrates a cross-sectional view of the structure of FIG. 4B following the process to etch portions of the second dielectric exposed by the mask.

FIG. 5A illustrates a cross-sectional view of the structure of FIG. 4B following the process to etch portions of the sacrificial layer 310 and the dielectric 306 exposed by the mask 311. In an embodiment, a plasma etch process is utilized to etch the sacrificial layer 310 and the dielectric 306. In an embodiment, the plasma etch process is sufficiently anisotropic and forms sidewalls 306A and 306B in the dielectric 306 that are substantially vertical with respect to an uppermost surface 302A. The process of plasma etching removes portions of the dielectric 306 and exposes an uppermost surface 302A of the dielectric 302.

Figure 5B:
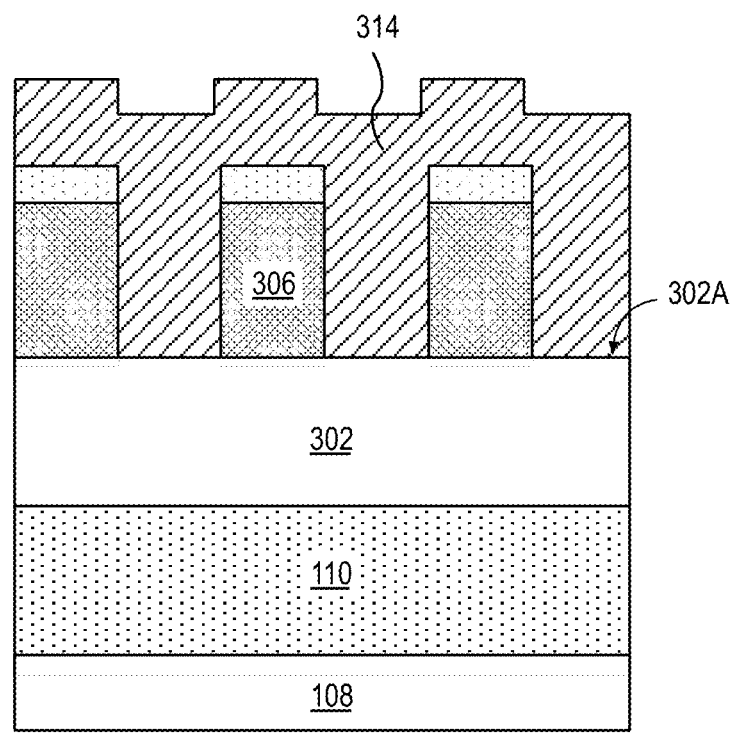
FIG. 5B illustrates a cross-sectional view of the structure of FIG. 5A following the deposition of a fourth dielectric adjacent to portions of the second dielectric and on the third dielectric.

FIG. 5B illustrates a cross-sectional view of the structure of FIG. 5A following the deposition of a dielectric 314. In an embodiment, the mask 311 is removed prior to deposition of the dielectric 314. In an embodiment, the dielectric 314 is blanket deposited on the sacrificial layer 310, in the opening 313 adjacent to dielectric 306 on uppermost dielectric surface 302A.

In an embodiment, the dielectric 314 is deposited by a PECVD or CVD process. The dielectric 314 includes a material that is different from a material of the dielectric 306 or 302. In an embodiment, dielectric 314 includes SiO2, SiOC, SiOCN, SiN or SiC.

Figure 6A:
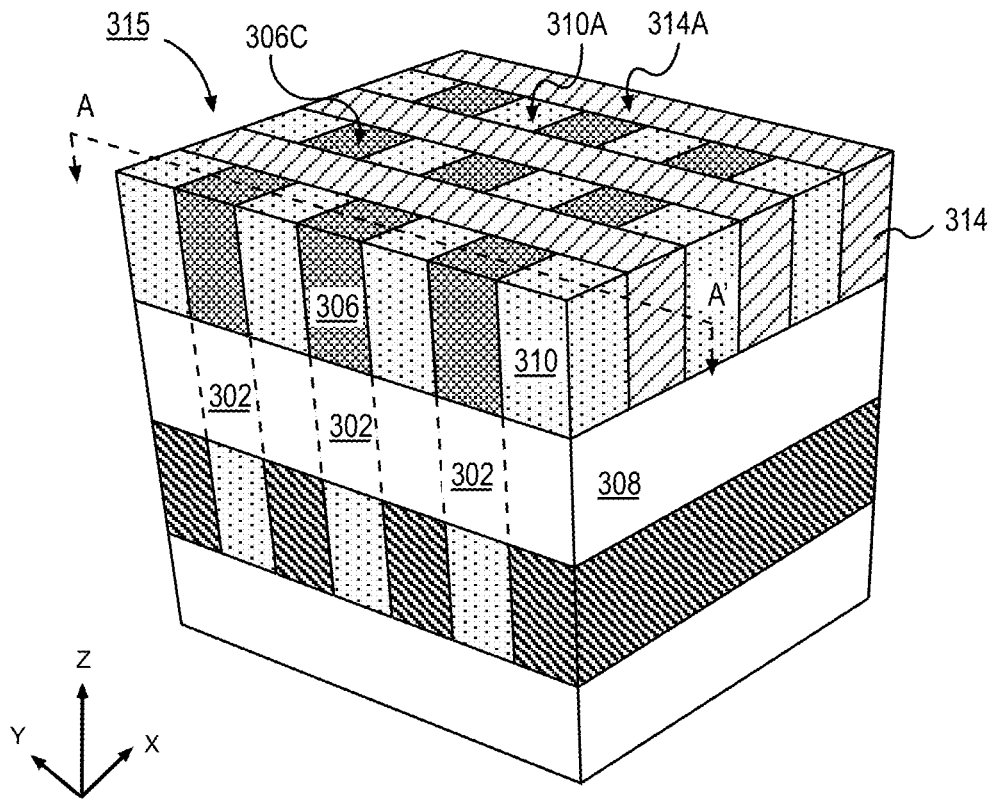
FIG. 6A illustrates an isometric view of the structure of FIG. 5B following the process to planarize the fourth dielectric, the sacrificial layer and the second dielectric.

FIG. 6A illustrates an isometric view of the structure of FIG. 5B following the process to planarize the dielectric 314, the sacrificial layer 310 and the dielectric 306 to form a mesh structure 315. In an embodiment, the planarization process includes a chemical mechanical polish (CMP) process. The CMP process forms uppermost surfaces 310A, 306C, and 314A that are co-planar or substantially co-planar. As shown, the dielectric 314 extends along the Y-direction.

As shown, each dielectric 306 forms a pillar structure, where each pillar of dielectric 306 is separated from another pillar of dielectric 306 by the sacrificial material 310 in the Y-direction and separated by the dielectric 314 in the X-direction.

Figure 6B:
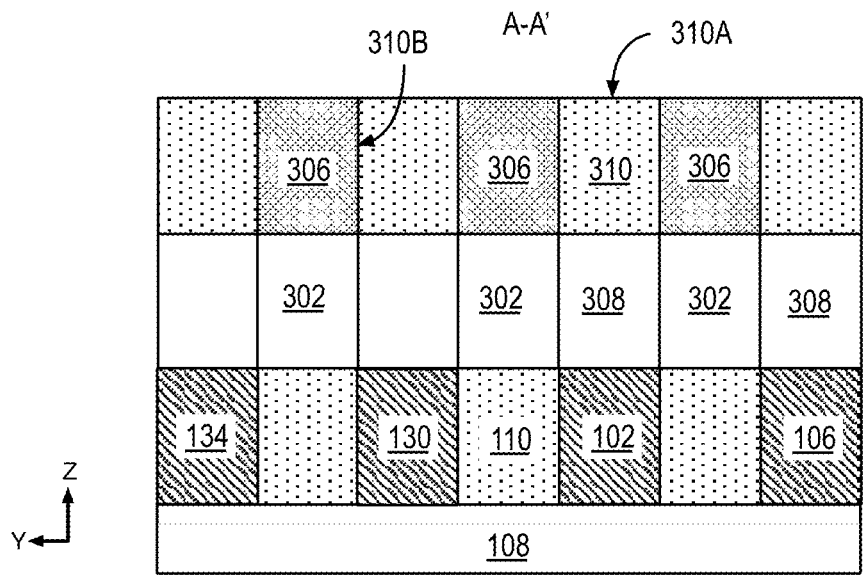
FIG. 6B illustrates a cross-sectional view through a line A-A' of the structure in FIG. 6A following the process to planarize the sacrificial layer and the second dielectric.

FIG. 6B illustrates a cross-sectional view through a line A-A' of the structure in FIG. 6A. In the illustrative embodiment, the sacrificial layer 310 has substantially vertical sidewalls 310B (relative to uppermost surface 310A) adjacent to dielectric 306.

FIG. 7A illustrates an isometric view of the structure of FIG. 6A following the process to remove the sacrificial layer 310 and recess portions of the dielectric 308. In an embodiment, the sacrificial layer 310 is removed by a plasma etch process. The plasma etch process may have a sufficiently low ion energy and does not recess the uppermost surfaces 306C and 314A. After removal of the sacrificial layer 310, the dielectric 308 is recessed below a lowermost surface 314B interfacing the dielectric 308. In an embodiment, the dielectric 308 is recessed by a plasma etch process, different from the etch process utilized to remove the sacrificial layer 310. In the illustrative embodiment, sidewalls 302B of the dielectric 302 and sidewall 308A are exposed after the plasma etch process. In an embodiment, sidewalls 302B and 308A are substantially vertical, as shown. In some examples, exposed uppermost surfaces 308B of the dielectric 308 have a concave profile as shown in the enhanced isometric illustration of FIG. 7B. The uppermost surfaces 308B may be concave shaped by the plasma etch process.

FIG. 7C illustrates a cross-sectional view through a line A-A' of the structure in FIG. 7A following the process to remove the sacrificial layer 310 and recess portions of the dielectric 308. In an embodiment, the dielectric 308 may have a portion 308C that remains adjacent to the sidewall 302B after the plasma etch process. In other embodiments, the dielectric 308 has a portion 308C that remains adjacent to the sidewall 302B and has a curved surface 308B. A remaining portion 308C may change the profile of a conductive via that may be formed above the one or more metal lines 102, 106, 130 or 134.

Figure 8A:
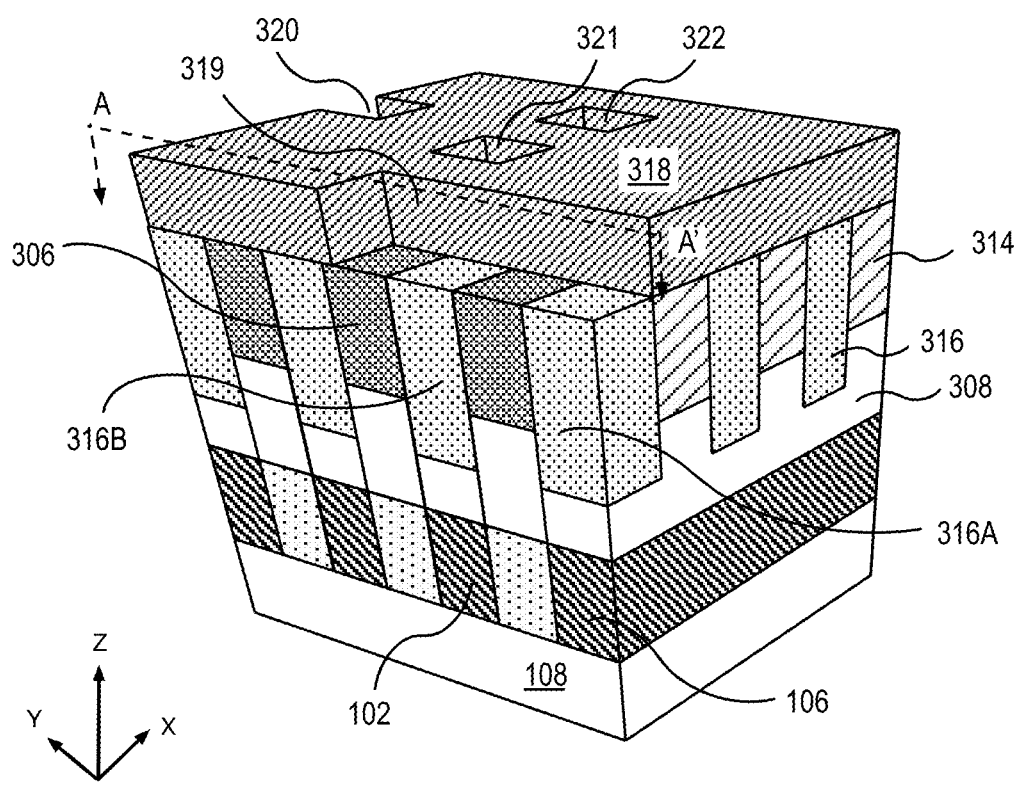
FIG. 8A illustrates an isometric view of the structure of FIG. 7A following the formation of a sacrificial material, following the process of planarization and formation of a mask on the sacrificial material, the second dielectric and on the fourth dielectric.

FIG. 8A illustrates an isometric view of the structure of FIG. 7A following the formation of a sacrificial material 316, following the process of planarization and formation of a mask 318 on the sacrificial material 316, on the dielectric 306 and on the dielectric 314.

In an embodiment, the sacrificial material 316 is the same or substantially the same as sacrificial material 310 described in association with FIG. 4A. The sacrificial material 316 may be blanket deposited using a PVD or a PECVD process. The sacrificial material 316 has a viscosity during the deposition that fills open spaces between the dielectric 314 and between dielectric 306 on the dielectric 308. In an embodiment, the sacrificial material 316 may be planarized by a CMP process. The planarization process also removes upper portions of the dielectric 306 and the dielectric 314.

The mask 318 may be formed by a lithographic process. The mask 318 includes various openings that define locations for where conductive vias will be formed in subsequent operations. As shown, the mask 318 includes an opening 319 which exposes sacrificial material portions 316A and 316B. In the illustrative embodiment, conductive vias will be formed on a portion of the metal lines 102 and 106 after removal of the sacrificial material portions 316A and 316B and the underlying dielectric 308. The lithographic process allows for some lithographic misalignment between the mask 318 and the sacrificial material 316. For example, as long as some portions of the sacrificial material portions 316A and 316B are exposed, desired portions of the sacrificial material portions 316A and 316B can be removed. In the illustrative embodiment, the mask 318 completely exposes sacrificial material portions 316A and 316B. The mask 318 also includes openings 320, 321 and 322.

Figure 8B:
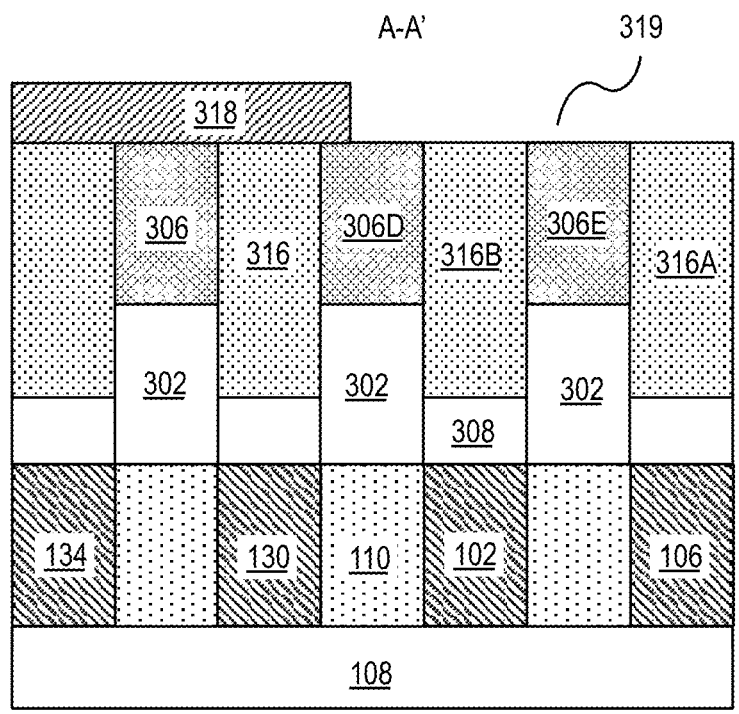
FIG. 8B illustrates a cross-sectional view through a line A-A' of the structure in FIG. 8A following the formation of a sacrificial material, following the process of planarization and formation of a mask on the sacrificial material, on the second dielectric and on the fourth dielectric.

FIG. 8B illustrates a cross-sectional view through a line A-A' of the structure in FIG. 8A. As illustrated the opening 319 partially covers a dielectric portion 306D and fully exposes the sacrificial material portions 316A and 316B (in the Y-direction). Utilizing directed self-assembly technique to define locations of the sacrificial material 316 is advantageous because the mask 318 does not need to be aligned to the exact sacrificial material portion being removed. It is important, however, to ensure that the mask adequately cover all sacrificial material portions that do not need to be removed.

Figure 9A:
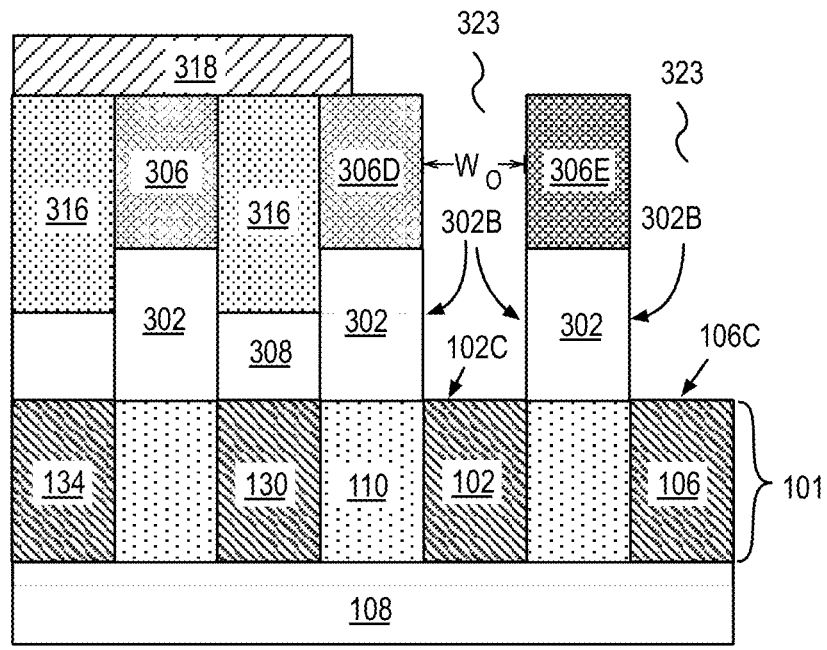
FIG. 9A illustrates cross-sectional view of the structure in FIG. 8B following the removal of sacrificial material and etching of the third dielectric material from areas not covered by mask.

FIG. 9A illustrates cross-sectional view of the structure in FIG. 8B following the removal of sacrificial material 316 and following the process to etch the dielectric 308 from areas not covered by mask 318. In an embodiment, the sacrificial material portions 316A and 316B are removed by a plasma etch process. The plasma etch process may have a sufficiently low ion energy and does not recess the upper portions of dielectric 306D, and 306E. After removal of the sacrificial material portions 316A and 316B, the dielectric 308 is removed to expose metal lines 102 and 106 respectively. In an embodiment, the dielectric 308 is recessed by a plasma etch process. In the illustrative embodiment, sidewalls 302B of the dielectric 302 is exposed after the plasma etch process. In an embodiment, a substantially vertical profile of sidewalls 302B remains unaltered after the plasma etch process. In embodiments, where the dielectric 308 includes a same material as the material of dielectric 302, some portions of dielectric 308 may remain on sidewall 302B and on top surface of metal lines 102C and 106C. In some such embodiments, opening 323 between the dielectric portions 306D and 306E, for example, has a width, $W_O$, that is greater than a width, $W_O$, on top surface 102C of the metal line 102. It is to be appreciated that all openings 323 will have substantially the same size and shape, if the metal lines in the metallization level 101 are of substantially the same width (in the Y-direction). After formation of openings 323, the mask 318 is removed.

Figure 9B:
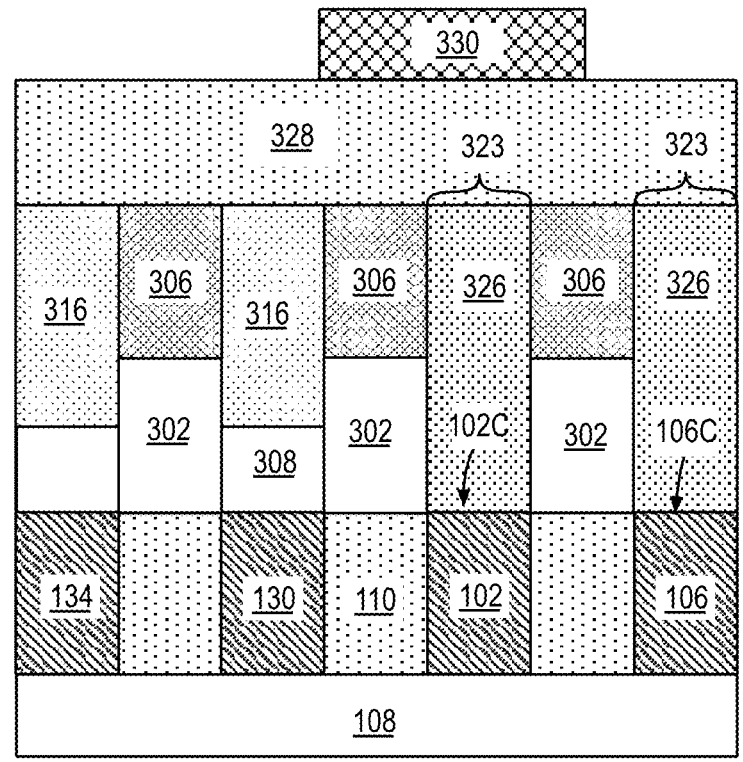
FIG. 9B illustrates a cross-sectional view of the structure in FIG. 9A following the formation of a second sacrificial material on exposed portions of the metal lines, planarization of the second sacrificial material, formation of a masking layer and a mask on the masking layer.

FIG. 9B illustrates cross-sectional view of the structure in FIG. 9A following the formation of a sacrificial material 326 in the openings 323, following the formation of a masking layer 328 and a mask 330 on the masking layer 328.

In an embodiment, the sacrificial material 326 is the same or substantially the same as sacrificial material 316 described in association with FIG. 9A. The sacrificial material 326 may be blanket deposited using a PVD or a PECVD process. The sacrificial material 326 has a viscosity during the deposition that fills openings 323. In an embodiment, the sacrificial material 326 may be planarized by a CMP process. The planarization process also removes upper portions of the dielectric 306 and the sacrificial material 316.

In an embodiment, the masking layer 328 is deposited on the dielectric 306, on the sacrificial material 316 and on the sacrificial material 326. In an embodiment, the masking layer 328 can be a photoresist material or an alloy that can be removed by a wet chemical process. The mask 330 may be formed by a lithographic technique. The mask 330 is designed to expose select portions of the dielectric 306 after the masking layer 328 is patterned.

Figure 9C:
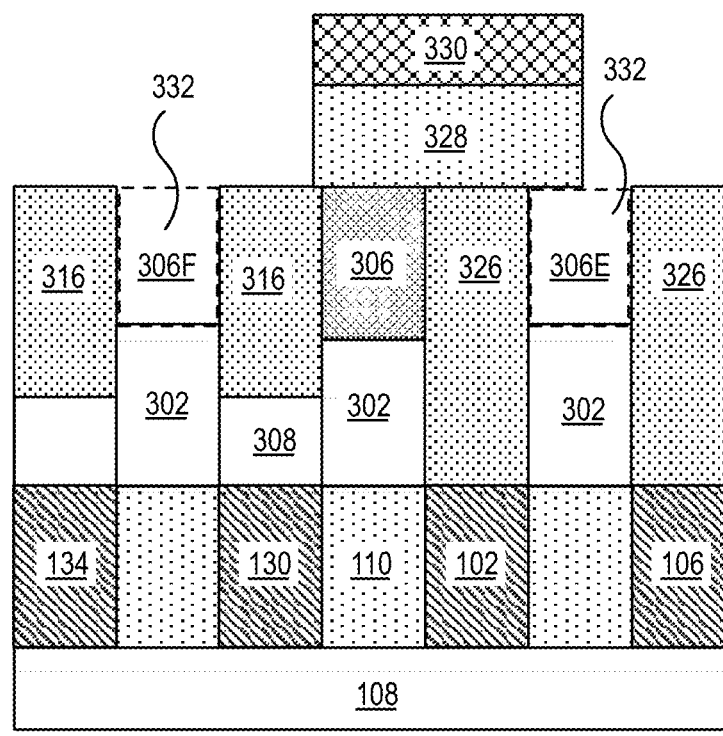
FIG. 9C illustrates cross-sectional view of the structure in FIG. 9B following the process to etch the masking layer, and portions of the second dielectric not covered by the mask.

FIG. 9C illustrates cross-sectional view of the structure in FIG. 9B following the process to etch the masking layer 328, and portions of the dielectric 306 not covered by the mask 330. In an embodiment, the masking layer 328 is etched by a plasma etch process. As illustrated the mask 330 is designed to enable removal of select portions of dielectric 306. As such, the mask 330 may not require exact alignment with respect to the sacrificial material 326 and 316. Partial exposure of the select portions of the dielectric 306 by the mask 330 is sufficient.

After masking layer 328 is etched, the select portions of dielectric 306 are removed using a wet chemical etch process. In the illustration, the dashed lines denote dielectric portions 306E and 306F that are etched by the wet chemical etch process. The etch process is elective to the masking layer 328, sacrificial layers 316 and 326 and dielectric 302, as illustrated. As shown, masking layer 328 is not perfectly aligned with dielectric portion 306E. However, since the dielectric portion 306E is predefined, it occupies a fixed volume, all of which is removed by the wet chemical etch. Removal of dielectric portions 306E and 306F form openings 332.

Figure 9D:
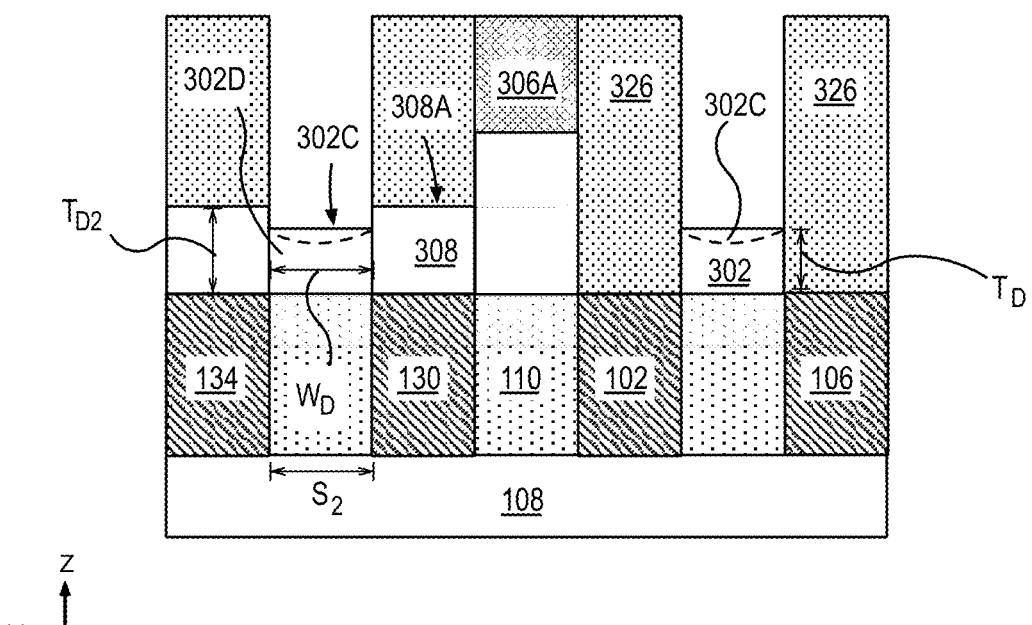
FIG. 9D illustrates cross-sectional view of the structure in FIG. 9C following the process to remove the masking layer and etch portions of the first dielectric selectively to the second dielectric and the third sacrificial material.

FIG. 9D illustrates cross-sectional view of the structure in FIG. 9C following the process to remove the mask 330, masking layer 328 and etch portions of the dielectric 302 selectively to the dielectric 306 and the sacrificial materials 316 and 326. In an embodiment, the dielectric 302 is recessed by a plasma etch process. While utilizing a wet chemical process to etch the dielectric 302 may be desirable, portions of the dielectric 302 (in the X-direction under the dielectric 314—not visible in Figure) would also be etched by a wet chemical etch. A directional etch, such as a plasma etch is desirable.

In the illustrative embodiment, the plasma etch recesses the surface 302C of the dielectric 302 below an uppermost surface 308A of the dielectric 308. In other embodiments, the dielectric surface 302C may be at a same level as surface 308A or at a level above surface 308A. The dielectric 302 has a thickness, $T_D$, and the dielectric 302 has a thickness, $T_{D1}$ as shown. The relative differences in $T_D$ and $T_{D1}$ will vary depending on the amount of recess of dielectric 302.

In some examples, the plasma etch process forms a concave or curved surface 302C. The curved surface 302C results in formation of a curved metal line portions described above in association with FIG. 1C.

It is to be appreciated that a dielectric portion 302D having a surface 302C recessed below the surface 308A leads to formation of the third metal line portion 126C described in association with FIG. 1B. When dielectric 302 is recessed by a directional plasma etch (in the negative Z direction), sidewalls of dielectric 308 are not etch and remain substantially vertical as shown. In such examples, a lateral width, $W_D$, of the dielectric 302 is substantially the same as the spacing $S_2$, between metal lines 134 and 130.

Figure 9E:
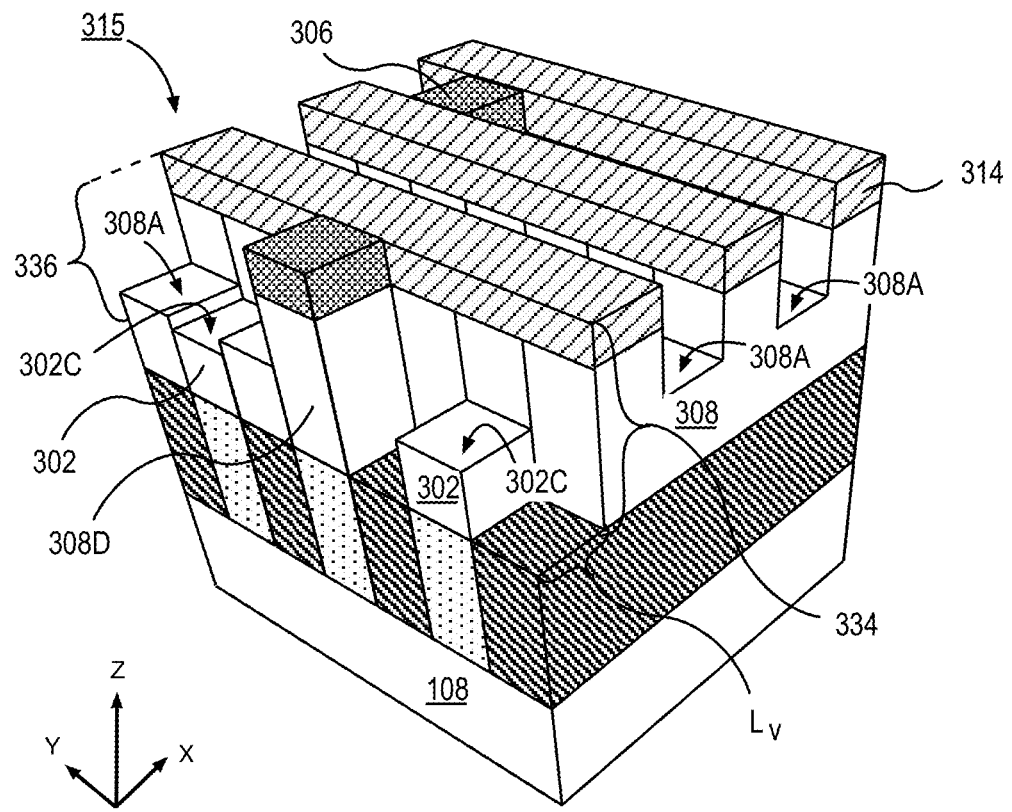
FIG. 9E illustrates an isometric view of the structure in FIG. 9D following a process to remove the third sacrificial material.

FIG. 9E illustrates an isometric view of the structure in FIG. 9D following a process to remove the sacrificial material 316 and 326. In an embodiment, when the sacrificial material 316 and 326 are a same material, a single plasma etch process can remove the sacrificial material 316 and 326.

After removal of the sacrificial material 316 and 326 various portions of metal lines 102, 106, 130 and 134 may be exposed depending on the layout of the masks utilized during the fabrication process. Exposed portions of the metal lines 102, 106, 130 and 134 provide locations where conductive vias will be formed in a subsequent operation. Each conductive via to be formed is limited in spatial extent to a length $L_V$, in the X-direction, as shown.

As shown, some columnar dielectric portions, such as dielectric portion 308D may remain. In an embodiment, dielectric portion 308D provides isolation between two metal lines that will subsequently formed. Also as shown, because of the recessing process described in association with FIG. 9D, surfaces 302C are at a lower level compared to surfaces 308A in the mesh structure 315.

Openings 334 provide space for conductive vias and a metal line that will be formed. Opening 336 provides a space for a metal line that will be formed in a subsequent operation. It is to be appreciated that the shape of the openings 334 and 336 illustrated in FIG. 10A are defined by polymer lines 300 and spaces between the polymer lines 300 described in association with FIG. 3B.

Figure 10A:
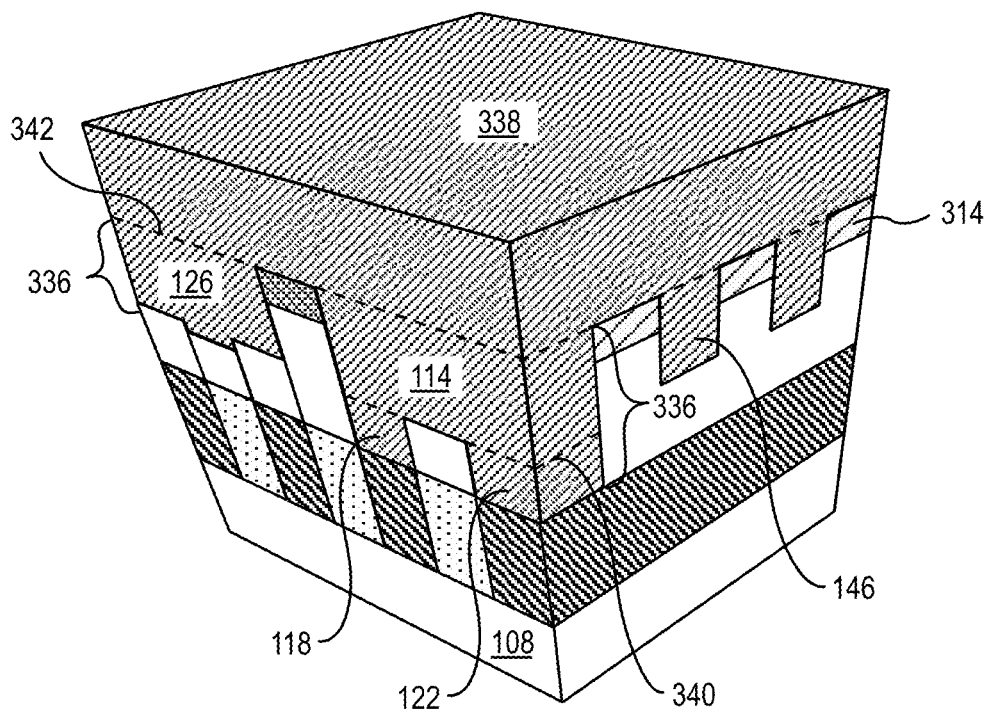
FIG. 10A illustrates an isometric view of the structure in FIG. 10A following a blanket deposition of conductive material.

FIG. 10A illustrates an isometric view of the structure in FIG. 10A following a process to deposit a conductive material 338 to form conductive vias 118 and 122 and metal lines 114 and 126.

It is to be appreciated that conductive vias 118 and 122 and metal line 114 are simultaneously formed by the deposition process. As shown boundaries of the conductive vias 118 and 122 are defined by dashed line 340. The conductive metal 338 deposited between dashed lines 340 and dash line 342 in the opening 336 defines the metal line 114. The conductive metal 338 deposited in the opening 336 defines the metal line 126.

In the illustrative embodiment, the metal lines 114, 126 and 146 are not isolated. A subsequent planarization process will isolate metal lines 114, 126 and 146 from each other.

Figure 10B:
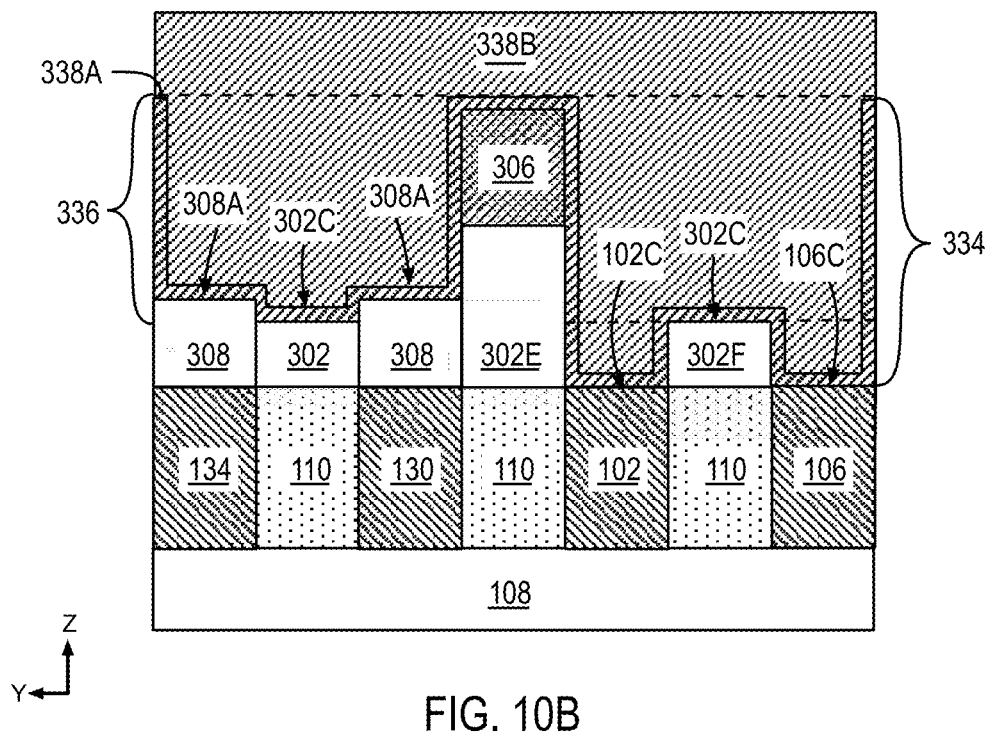
FIG. 10B illustrates a cross-sectional view of the structure in FIG. 9D following a blanket deposition of a liner followed by a blanket deposition of a conductive material on the liner.

FIG. 10B illustrates cross-sectional view of the structure in FIG. 10A in an embodiment, where conductive material 338 may include more than one material. For example, a liner layer 338A may be blanket deposited in the openings 334 and 336, followed by deposition of a fill metal 338B such as tungsten, cobalt, or nickel, on the liner layer 338A.

In the illustrative embodiment, the liner layer 338A is deposited on exposed uppermost surfaces 302C and 308A on sidewalls of dielectric portion 302E in the opening 338. The liner layer is also deposited on sidewalls and on upper surfaces of dielectric 306. The liner layer 338A is also deposited on uppermost surface 102C and 106C of the metal lines 102 and 106, respectively, on surface 302C and on sidewalls of dielectric portion 302F in the opening 336.

In an embodiment, the liner layer 338A includes ruthenium or tantalum and the fill metal 338B includes tungsten, cobalt, nickel or copper.

Figure 11:
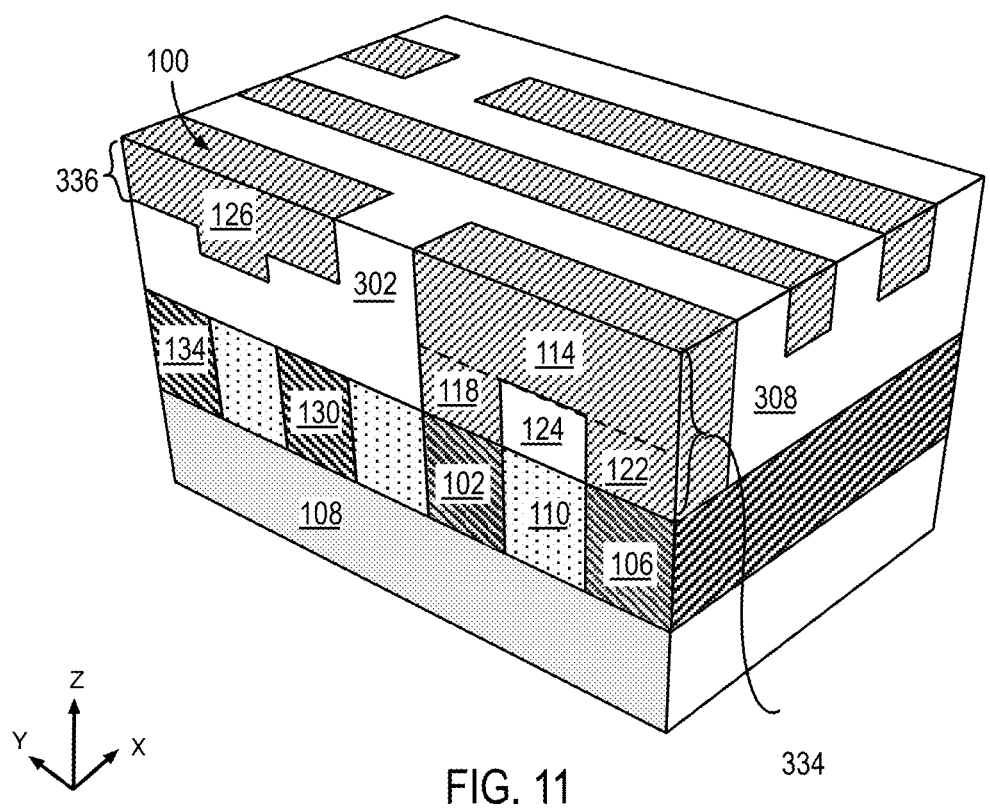
FIG. 11 illustrates an isometric view of the structure in FIG. 10A following a process to form conductive vias and metal lines, in accordance with an embodiment of the present disclosure.

FIG. 11 illustrates an isometric view of the structure in FIG. 10A following a process to planarize of the conductive material. In an embodiment, the conductive material may be planarized by a CMP process. The CMP process may be utilized to remove the excess conductive material from above the dielectric 302, 308, 306 and 314. In the illustrative embodiment, the planarization process is continued until dielectric 306 and 314 are also completely removed and metal line 126 is formed in opening 336 and conductive vias 118 and 122 and metal line 114 are formed in the opening 334.

The process operations described in association with FIG. 3A to FIG. 10B describe some combination of operations that result in the structure illustrated in FIGS. 11A and 1A. It is to be understood that while the masks utilized in the fabrication process define locations for various openings to be formed, the metal lines and/or vias formed are self-aligned with respect to an axial line through each metal line 102, 106, 130 or 134. While various conductive vias may have vertical or slanted sidewalls there are no misalignment between the conductive vias and metal lines in the metallization levels 101 and 111 because of the self-alignment process described above.

Figure 12:
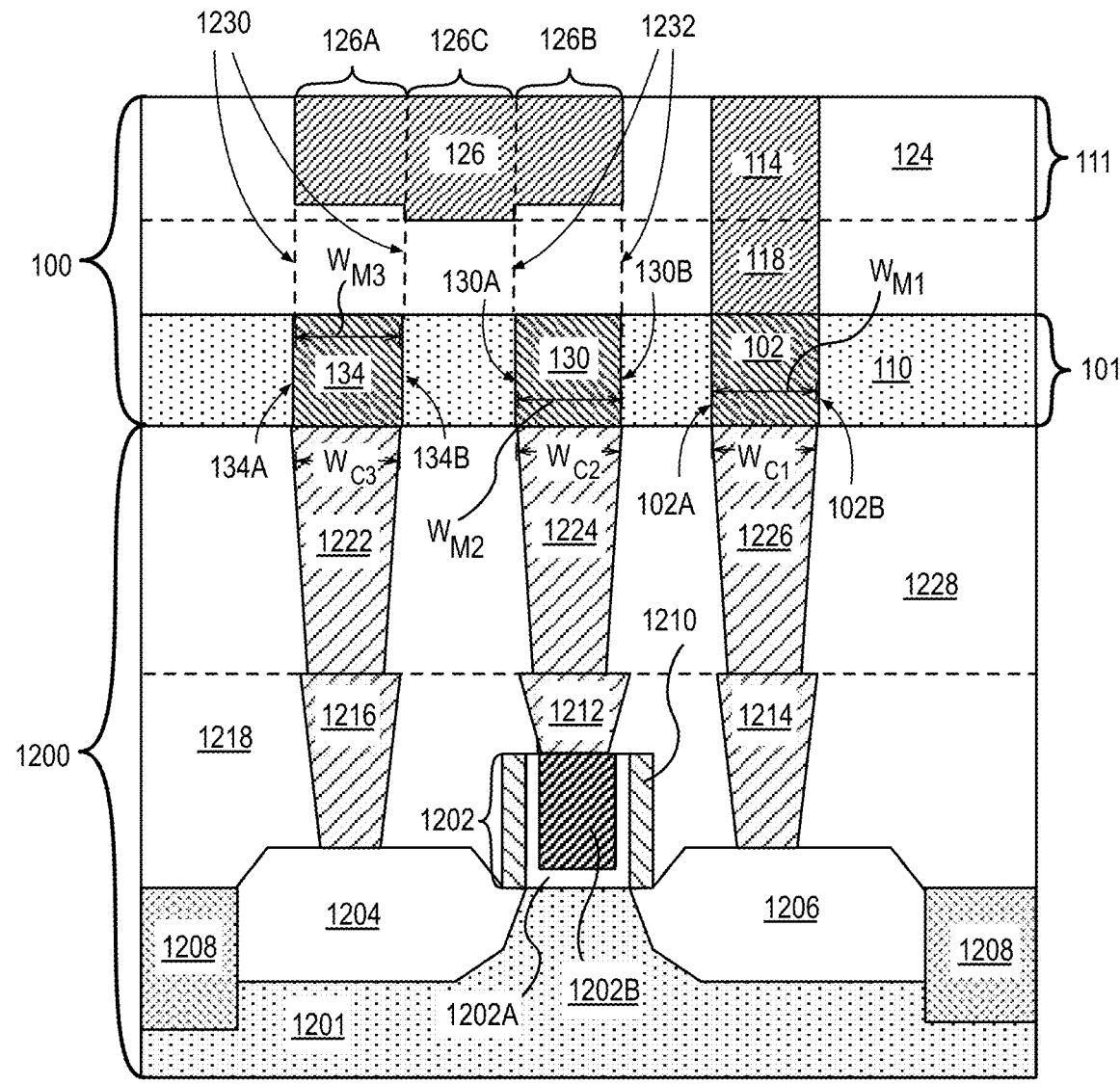
FIG. 12 illustrates a cross-sectional view of an integrated circuit structure coupled with a transistor.

FIG. 12 illustrates a cross-sectional view of an integrated circuit structure such as integrated circuit interconnect structure 100 coupled with a MOS transistor 1200, in accordance with an embodiment of the present disclosure. The integrated circuit interconnect structure 100 includes metal lines 102, 106, 130 and 134 embedded in a dielectric 110 on a plane above MOS transistor 1200.

In an embodiment, the transistor 1200 is on a substrate 1201 and has a gate 1202, a source region 1204, and a drain region 1206. In the illustrative embodiment, an isolation 1208 is adjacent to the source region 1204, drain region 1206 and portions of the substrate 1201. In some implementations of the disclosure, such as is shown, a pair of sidewall spacers 1210 are on opposing sides of the gate 1202. The transistor 1200 further includes a gate contact 1212 above and electrically coupled to the gate 1202, and a drain contact 1214 above and electrically coupled to the drain region 1206, and a source contact 1216 above and electrically coupled to the source region 1204, as is illustrated in FIG. 12. The transistor 1200 also includes dielectric 1218 adjacent to the gate 1202, source region 1204, drain region 1206, isolation 1208, sidewall spacers 1210, gate contact 1212, contact 1214 and contact 1216. In the illustrative embodiment, the conductive interconnect 1222 is directly on and in contact with the contact 1216. In other embodiments, there are one or more additional interconnect structures between source region 1204 and conductive interconnect 1222.

Gate contact 1212 and contact 1214 are each coupled with interconnects. In the illustrative embodiment, gate contact 1212 is coupled with a gate interconnect 1224 and the contact 1214 is coupled with an interconnect 1226. A dielectric 1228 is adjacent to interconnect 1226, interconnect 1224, interconnect 1222, substrate 1201, source contact 1216 and gate contact 1212 and contact 1214.

In an embodiment, the integrated circuit interconnect structure 100 has one or more structural and material properties described above in association the integrated circuit interconnect structure 100 illustrated in FIG. 1A. In the illustrative embodiment, the integrated circuit interconnect structure 100 includes first metallization level 101 including a metal line 102 having a first sidewall 102A and a second sidewall 102B extending a length in the X-direction. The metallization level 101 is above the MOS transistor 1200. The metal line 102 is directly on and coupled with interconnect 1226. The metal line 102 is directly on and coupled with interconnect 1226 has a length in the X-direction, that is less than or equal to a length in the X-direction of the interconnect 1226. The metal line 102 may have a width, $W_{M1}$, in the Y direction, that is equal to, greater than or less than a width, $W_{C1}$, of the of the interconnect 1226 in the Y direction.

The integrated circuit interconnect structure 100 further includes metallization level 111 above the metallization level 101. In the illustrative embodiment, the metallization level 111 includes metal line 114 extending a length in the Y-direction, over the metal line 102 but not beyond the sidewalls 102A or 102B. Conductive via 118 is between the metallization level 101 and the second metallization level 111. As shown the conductive via 118 does not extend beyond the sidewall 102A or sidewall 102B.

In the illustrative embodiment, the metallization level 111 further includes a metal line 126 extending a length in the Y-direction over metal line 130 and metal line 134, where the metal line 130 and the metal line 134 are in the metallization level 101. As shown, the metal line 130 has sidewalls 130A and 130B extending a length in the X-direction and the metal line 134 has sidewalls 134A and 134B also extending a length in the X-direction.

The metal line 130 is directly on and coupled with interconnect 1224 has a length in the X-direction, that is less than or equal to a length in the X-direction of the interconnect 1224. The metal line 130 may have a width, $W_{M2}$, in the Y direction, that is equal to, greater than or less than a width, $W_{C2}$, of the of the interconnect 1224 in the Y direction.

The metal line 134 is directly on and coupled with interconnect 1222 has a length in the X-direction, that is less than or equal to a length in the X-direction of the interconnect 1222. The metal line 134 may have a width, $W_{M2}$, in the Y direction, that is equal to, greater than or less than a width, $W_{C3}$, of the of the interconnect 1222 in the Y direction.

The metal line 126 has one or more properties such as lateral width, portions and material composition as described above in association with FIG. 1B. As shown, the metal line 126 is aligned with the metal lines 134 and 130 and with the interconnects 1222 and 1224. In other embodiments, metal line 126 may not be substantially aligned with interconnects 1222 and 1222 even though it is substantially aligned with the metal lines 134 and 130.

In some embodiments, a single conductive via inside dashed lines 1230 is between the metal line 126 and directly adjacent and on metal line 134. In other embodiment, a single conductive via inside dashed lines 1232 is between the metal line 126 and directly adjacent and on metal line 130. In some such embodiments, the conductive via inside dashed lines 1230 or inside dashed lines 1232 is on the same plane as the conductive via 118.

In other embodiments, a metal line substantially similar to metal line 126 is on a plane behind the Y-Z plane illustrated, where the metal line is not in electrical contact with metal line 126. The metal line on the plane behind the Y-Z plane illustrated may be connected with a single conductive via inside dashed lines 1230 or with a single conductive via inside dashed line 1232 and provide electrical connectivity to metal line 134 or metal line 130, respectively. A physical (and electrical) connection between a metal line on a plane behind the Y-Z plane, and the metal line 134 or the metal line 130 and with the interconnects 1222 or 1224, respectively, may be possible because the metal lines 134 and 130 and the interconnects 1222 and 1224 may extend in the X-direction (out of the page of the Figure). While conductive via 118 is illustrated in the Y-Z plane in FIG. 12, conductive via 118 may be in a plane behind the Y-Z plane illustrated, in other embodiments. In some such embodiments, a single conductive via inside dashed lines 1230 or with a single conductive via inside dashed line 1232 may on a plane in-front of the conductive via 118.

In an embodiment, the underlying substrate 1201 represents a surface used to manufacture integrated circuits. Suitable substrate 1201 includes a material such as single crystal silicon, polycrystalline silicon and silicon on insulator (SOI), as well as substrates formed of other semiconductor materials. In some embodiments, the substrate 1201 is the same as or substantially the same as the substrate 108. The substrate 1201 may also include semiconductor materials, metals, dielectrics, dopants, and other materials commonly found in semiconductor substrates.

In an embodiment, the transistor 1200 associated with substrate 1201 are metal-oxide-semiconductor field-effect transistors (MOSFET or simply MOS transistors), fabricated on the substrate 1201. In some embodiments, the transistor 1200 is an access transistor 1200. In various implementations of the disclosure, the transistor 1200 may be planar transistors, nonplanar transistors, or a combination of both.

Nonplanar transistors include FinFET transistors such as double-gate transistors and tri-gate transistors, and wrap-around or all-around gate transistors such as nanoribbon and nanowire transistors.

In some embodiments, gate 1202 includes at least two layers, a gate dielectric layer 1202A and a gate electrode 1202B. The gate dielectric layer 1202A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1202A to improve its quality when a high-k material is used.

The gate electrode 1202B of the access transistor 1200 of substrate 1201 is formed on the gate dielectric layer 1202A and may consist of at least one P-type work function metal or N-type work function metal, depending on whether the transistor is to be a PMOS or an NMOS transistor. In some implementations, the gate electrode 1202B may consist of a stack of two or more metal layers, where one or more metal layers are work function metal layers and at least one metal layer is a conductive fill layer.

For a PMOS transistor, metals that may be used for the gate electrode 1202B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1202B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1202B may consist of one or more U-shaped metal layers formed atop one or more planar, non-U-shaped layers.

The sidewall spacers 1210 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1204 and drain region 1206 are formed within the substrate adjacent to the gate stack of each MOS transistor. The source region 1204 and drain region 1206 are generally formed using either an implantation/diffusion process or an etching/deposition process. In the former process, dopants such as boron, aluminum, antimony, phosphorous, or arsenic may be ion-implanted into the substrate to form the source region 1204 and drain region 1206. An annealing process that activates the dopants and causes them to diffuse further into the substrate typically follows the ion implantation process. In the latter process, the substrate 1201 may first be etched to form recesses at the locations of the source and drain regions. An epitaxial deposition process may then be carried out to fill the recesses with material that is used to fabricate the source region 1204 and drain region 1206. In some implementations, the source region 1204 and drain region 1206 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1204 and drain region 1206 may be formed using one or more alternate semiconductor materials such as germanium or a group III-V material or alloy. And in further embodiments, one or more layers of metal and/or metal alloys may be used to form the source region 1204 and drain region 1206.

In an embodiment, the source contact 1216, the drain contact 1214 and gate contact 1212 each include a liner layer and fill metal. In an embodiment, the liner layer incudes $T_1$, Ru or Al and a conductive cap on the liner layer. The conductive cap may include a material such as W, Co or Cu.

In an embodiment, the source interconnect 1222 gate interconnect 1224, conductive interconnect drain interconnect 1226 includes a material that is the same or substantially the same as the material of the source contact 1216, gate contact 1212 or drain contact 1214. In one such embodiment, the fill metal includes copper.

The isolation 1208 and dielectric 1218 and 1228 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 13:
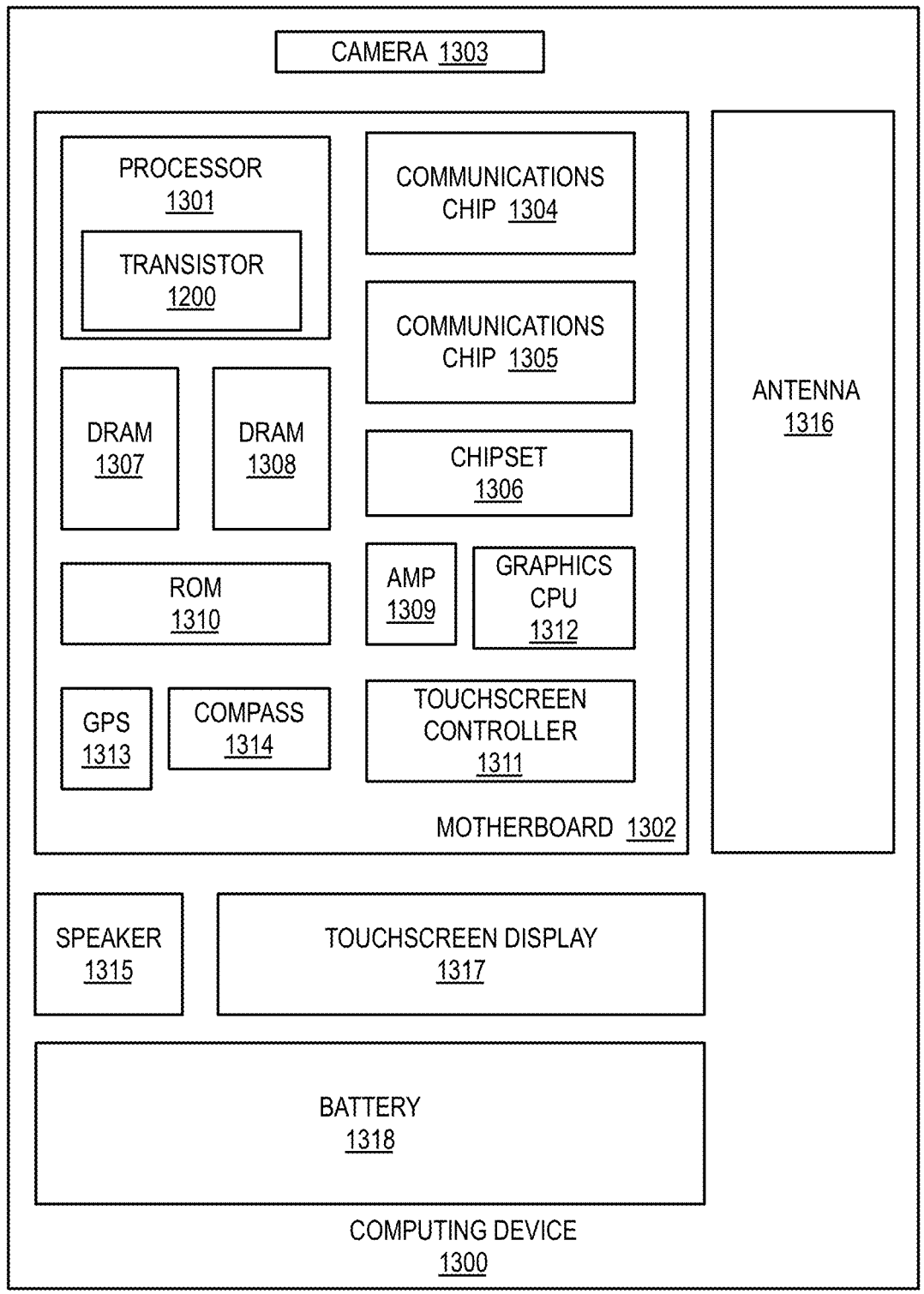
FIG. 13 illustrates a computing device in accordance with embodiments of the present disclosure.

FIG. 13 illustrates a computing device 1300 in accordance with embodiments of the present disclosure. As shown, computing device 1300 houses a motherboard 1302. Motherboard 1302 may include a number of components, including but not limited to a processor 1301 and at least one communications chip 1304 or 1305. Processor 1301 is physically and electrically coupled to the motherboard 1302. In some implementations, communications chip 1305 is also physically and electrically coupled to motherboard 1302. In further implementations, communications chip 1305 is part of processor 1301.

Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset 1306, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1305 enables wireless communications for the transfer of data to and from computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1305 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1300 may include a plurality of communications chips 1304 and 1305. For instance, a first communications chip 1305 may be dedicated to shorter range wireless communications such as Wi-Fi and Bluetooth and a second communications chip 1304 may be dedicated to longer range wireless communications such as GPS, EDGE, GPRS, CDMA, WiMAX, LTE, Ev-DO, and others.

Processor 1301 of the computing device 1300 includes an integrated circuit die packaged within processor 1301. In some embodiments, the integrated circuit die of processor 1301 includes one or more transistors such as transistor 1200 coupled with integrated circuit interconnect structure 100, (described in association with FIG. 12), interconnect structures, and non-volatile memory (NVM) devices such as magnetic tunnel junction and resistive random-access memory devices. The term "processor" may refer to any device or portion of a device that processes electronic data from registers and/or memory to transform that electronic data into other electronic data that may be stored in registers and/or memory.

Communications chip 1305 also includes an integrated circuit die packaged within communication chip 1305. In another embodiment, the integrated circuit die of communications chips 1304, 1305 includes one or more transistors, interconnect structures such as integrated circuit interconnect structure 100 (described in association with FIGS. 1A-1E), and non-volatile memory devices such as magnetic tunnel junction and resistive random-access memory devices. Depending on its applications, computing device 1300 may include other components that may or may not be physically and electrically coupled to motherboard 1302. These other components may include, but are not limited to, volatile memory (e.g., DRAM) 1307, 1308, non-volatile memory (e.g., ROM) 1310, a graphics CPU 1312, flash memory, global positioning system (GPS) device 1313, compass 1314, a chipset 1306, an antenna 1316, a power amplifier 1309, a touchscreen controller 1311, a touchscreen display 1317, a speaker 1315, a camera 1303, and a battery 1318, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1300 and discussed above may contain a stand-alone integrated circuit memory die that includes one or more arrays of NVM devices coupled with a transistor connected to external circuitry by one or more interconnect structures such as integrated circuit interconnect structure 100 (described in association with FIGS. 1A-1E). In an embodiment, the NVM devices may include spintronics based devices, magnetic tunnel junction devices, resistive random-access devices. In other embodiments two or three terminal spin orbit torque memory devices may be coupled with one or more transistors.

In various implementations, the computing device 1300 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Accordingly, one or more embodiments of the present disclosure may relate generally to the fabrication of integrated circuit interconnect structure for logic and embedded memory.

In a first example, an integrated circuit interconnect structure includes a first metallization level including a first metal line having a first sidewall and a second sidewall extending a length in a first direction. A second metal line is adjacent to the first metal line and a dielectric is between the first metal line and the second metal line. A second metallization level is above the first metallization level where the second metallization level includes a third metal line extending a length in a second direction orthogonal to the first direction. The third metal line extends over the first metal line and the second metal line but not beyond the first sidewall. A conductive via is between the first metal line and the third metal line where the conductive via does not extend beyond the first sidewall or beyond the second sidewall.

In a first example, an integrated circuit interconnect structure includes a first metallization level including a first metal line having a first sidewall and a second sidewall extending a length in a first direction. A second metal line is adjacent to the first metal line and a dielectric is between the first metal line and the second metal line. A second metallization level is above the first metallization level where the second metallization level includes a third metal line extending a length in a second direction orthogonal to the first direction. The third metal line extends over the first metal line and the second metal line but not beyond the first sidewall. A conductive via is between the first metal line and the third metal line where the conductive via does not extend beyond the first sidewall or beyond the second sidewall.

In second examples, for any of the first examples, the conductive via is a first conductive via and the integrated circuit interconnect structure further includes a second conductive via between the second metal line and the third metal line, the second conductive via not extending beyond a first sidewall or a second sidewall of the second metal line.

In third examples, for any of the first through second examples, the first conductive via has a first lateral width in the second direction, and the second conductive via has a second lateral width in the second direction, wherein the first lateral width is substantially equivalent to the first lateral width.

In fourth examples, for any of the first through third examples, the first metal line has a third lateral width in the second direction, and the second metal line has a fourth lateral width in the second direction, wherein the third lateral width is substantially equal to the fourth lateral width and wherein the first lateral width is substantially equal to the third lateral width and the second lateral width is substantially equal to the fourth lateral width.

In fifth examples, for any of the first through fourth examples, the first lateral width decreases from a maximum at an interface with the third metal line to a minimum at an interface with the first metal line.

In sixth examples, for any of the first through fifth examples, the second lateral width decreases from a maximum at an interface with the third metal line to a minimum at an interface with the second metal line.

In seventh examples, for any of the first through sixth examples, the second metallization level further includes a fourth metal line extending a length in the second direction over a fifth metal line and a sixth metal line, and wherein the fifth metal line and a sixth metal line are in the first metallization level.

In eighth examples, for any of the first through seventh examples, the fifth metal line has a first sidewall and a second sidewall extending a length in the first direction and the sixth metal line has a first sidewall and a second sidewall extending a length in the first direction.

In ninth examples, for any of the first through eighth examples, the fourth metal line includes a first portion having a first vertical thickness in a third direction orthogonal to the second direction and orthogonal to the first direction. The fourth metal line further includes a second portion having the first vertical thickness and a third portion between the first portion and the second portion having a second vertical thickness, wherein the second vertical thickness is greater than the first vertical thickness.

In tenth examples, for any of the first through ninth examples, the third portion does not extend over the fifth metal line or the sixth metal line.

In eleventh examples, for any of the first through tenth examples, the fifth metal line and the sixth metal line are separated by a spacing in the second direction, where the third portion has a lateral width in the second direction, and wherein the lateral width has a midpoint that is directly above a point midway between the spacing.

In twelfth examples, for any of the first through eleventh examples, the second vertical thickness is substantially equal to a vertical thickness along the second direction of the third metal line.

In a thirteenth example, a method of fabricating an integrated circuit interconnect structure includes forming a first metal line and a second metal line extending a length in a first direction in a first metallization layer, where the first metal line is separated from the second metal line by a first dielectric. The method further includes forming a stack of polymer structure selectively on the first metal line and on the second metal line, where the stack of polymer structure includes a first polymer structure on a second polymer structure. The method further includes forming a second dielectric adjacent to the first polymer structure and a third dielectric adjacent to the second polymer structure, where the second dielectric and the third dielectric do not extend over the first metal line or the second metal line. The method further includes removing the stack of polymer structure from above the first metal line and the second metal line and forming a fourth dielectric adjacent to the second dielectric on the first metal line and on the second metal line. The method further includes patterning an opening in the third dielectric in a second direction orthogonal to the first direction, where the opening exposes portions of the fourth dielectric. The method further includes forming a mesh structure by forming a fifth dielectric in the opening on portions of the fourth dielectric and exposing a portion of the first metal line or the second metal line by etching the second dielectric and the third dielectric. The method further includes forming a conductive via on the exposed portion of the first metal line or the second metal line and forming a third metal line in a second metallization layer on the conductive via, where the third metal line extends a length in a second direction orthogonal to the first direction.

In fourteenth examples, for any of the thirteenth example, etching removes portions of the second dielectric and the third dielectric to expose a portion of the first metal line in a first plane and a portion of the second metal line in the first plane.

In fifteenth examples, for any of the thirteenth through fourteenth examples, the conductive via is a first conductive via and the method further includes forming a second conductive via, where the first conductive via is formed on the first metal line and the second conductive via is formed on the second metal line.

In a sixteenth example, for any of the thirteenth through fifteenth examples, the first conductive via is formed to have a sidewall in the first direction that does not extend beyond a sidewall of the first metal line in the first direction and the second conductive via is formed to have a sidewall along the first direction that does not extend beyond a sidewall of the second metal line in the first direction.

In seventeenth examples, for any of the thirteenth through sixteenth examples, forming the conductive via and the metal line include depositing a liner layer on the first metal line or the second metal line and depositing a fill material on the liner layer.

In eighteenth examples, for any of the thirteenth through seventeenth examples, the method further includes forming a fourth metal line in the second metallization level above a fifth metal line and a sixth metal line in the first metallization level.

In a nineteenth example, a system includes a processor and a radio transceiver coupled to the processor, where the transceiver includes a transistor. The transistor includes a drain contact coupled to a drain, a source contact coupled to a source and a gate contact coupled to a gate. An integrated circuit interconnect structure is coupled with the drain contact, where the integrated circuit interconnect structure includes a first metallization level including a first metal line having a first sidewall and a second sidewall extending a length in a first direction. A second metallization level is above the first metallization level where the second metallization level includes a second metal line extending a length in a second direction orthogonal to the first direction. The second metal line extends over the first metal line but not beyond the first sidewall. A conductive via is between the first metal line and the second metal line where the conductive via does not extend beyond the first sidewall or beyond the second sidewall In twentieth examples, for any of the nineteenth example, the system further includes a battery coupled to power at least one of the processor or memory.

What is claimed is:

1. A method of fabricating an integrated circuit interconnect structure, the method comprising:
forming first and second parallel lines of conductive material, each line extending in a first direction with a first dielectric therebetween;
forming a stack structure over the first dielectric, the stack structure comprising a second dielectric and a third dielectric;
forming a fourth dielectric over the first and second lines;

patterning an opening in the third dielectric and extending in a second direction, orthogonal to the first direction, wherein the opening exposes a portion of the fourth dielectric;

forming a fifth dielectric in the opening and on the exposed portion of the fourth dielectric;

exposing a portion of each of the first and second lines by etching the fourth dielectric where not masked by the fifth dielectric; and forming a conductive feature on the exposed portion of the first and second lines.

2. The method of claim 1, wherein etching the fourth dielectric exposes a portion of the first and second lines within a first plane.

3. The method of claim 1, wherein the conductive feature comprises a first conductive via extending through the fourth dielectric and on the first line, and a second conductive via extending through the fourth dielectric and on the second line.

4. The method of claim 1, wherein the conductive feature comprises a conductive line embedded within the third dielectric along the second direction and joining the first and second conductive vias.

5. The method of claim 3, wherein the first conductive via has a sidewall in the first direction that does not extend beyond a sidewall of the first line and the second conductive via has a sidewall in the first direction that does not extend beyond a sidewall of the second line.

6. The method of claim 3, wherein forming the conductive feature comprises depositing a liner layer on the first line, on the second line and on the second dielectric, and depositing a fill material on the liner layer.

7. The method of claim 1, wherein forming the stack structure over the first dielectric comprises:
forming polymer structures selectively on individual ones of the first and second lines;
forming the stack structure between adjacent ones of the polymer structures; and
exposing the first and second lines by removing the polymer structures.

8. The method of claim 7, wherein forming the stack structure over the first dielectric comprises:
forming first polymer lines selectively on individual ones of the first and second lines;
forming the second dielectric between the first polymer lines;
forming second polymer lines selectively on individual ones of the first polymer lines; and
forming the third dielectric between the second polymer lines.

9. The method of claim 7, further comprising:
depositing the fourth dielectric over the first and second lines and adjacent to a sidewall of the second dielectric;
depositing a sacrificial material over the fourth dielectric and adjacent to a sidewall of the third dielectric; and
patterning trenches through the third dielectric and the sacrificial material, the trenches extending in the second direction.

10. The method of claim 9, further comprising:
depositing the fifth dielectric in the trenches;
removing the sacrificial material selectively to the third and fifth dielectrics; and
etching a partial thickness of the fourth dielectric.

11. The method of claim 10, further comprising:
planarizing a second sacrificial material with the fifth dielectric and the third dielectric; and
etching a first pattern through the second sacrificial material and the fourth dielectric to expose the first and second lines.

12. The method of claim 11, further comprising:
etching a second pattern through at least the third dielectric and stopping on the second dielectric between the first and second lines.

13. A method of fabricating an integrated circuit interconnect structure, the method comprising:
forming a plurality of conductive lines extending in a first direction with a first dielectric therebetween;
forming a stack of polymer structures selectively on individual ones of the plurality of conductive lines;
forming a stack of dielectrics adjacent to the stack of polymer structures;
removing the stack of polymer structures selectively to the stack of dielectrics;
forming a mesh structure comprising the stack of dielectrics and a dielectric line extending in a second direction, orthogonal to the first, that intersects the stack of dielectrics;
patterning the mesh structure to expose some portion of the conductive lines; and
forming a conductive feature that couples to the exposed portion of the conductive lines.

14. The method of claim 13, wherein forming the stack of polymer structures comprises
forming first polymer lines selectively on individual ones of the conductive lines;
forming one dielectric of the stack of the dielectrics between the first polymer lines;
forming second polymer lines selectively on individual ones of the first polymer lines; and
forming another dielectric of the stack of dielectrics between the second polymer lines.

15. The method of claim 13, where forming the mesh structure comprises:
depositing a dielectric over the conductive lines and adjacent to a sidewall of the stack of dielectrics;
recessing the dielectric relative to the stack of dielectrics;
depositing a sacrificial material over the recessed dielectric and adjacent to an exposed sidewall of the stack of dielectrics; and
patterning trenches through the dielectric and the sacrificial material, the trenches extending in the second direction.

16. The method of claim 15, further comprising:
depositing a dielectric in the trenches; and
removing the sacrificial material.

17. The method of claim 16, further comprising:
planarizing a second sacrificial material with the dielectric that was deposited in the trenches; and
exposing the conductive lines by etching a pattern through the second sacrificial material.

18. The method of claim 13, wherein the conductive feature comprises a first conductive via on a first of the conductive lines, and a second conductive via on a second of the conductive lines.

19. The method of claim 18, wherein the conductive feature comprises a conductive line extending in the second direction and joining the first and second conductive vias.

20. The method of claim 19, wherein forming the conductive feature comprises depositing a liner layer and depositing a fill material on the liner layer.

* * * * *